(12) United States Patent
Chitnis et al.

(10) Patent No.: US 8,878,219 B2
(45) Date of Patent: Nov. 4, 2014

(54) FLIP-CHIP PHOSPHOR COATING METHOD AND DEVICES FABRICATED UTILIZING METHOD

(75) Inventors: Ashay Chitnis, Goleta, CA (US); James Ibbetson, Santa Barbara, CA (US); Bernd Keller, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 12/008,477

(22) Filed: Jan. 11, 2008

(65) Prior Publication Data

US 2009/0179207 A1    Jul. 16, 2009

(51) Int. Cl.
| | |
|---|---|
| H01L 33/00 | (2010.01) |
| H01L 33/50 | (2010.01) |
| H01L 33/64 | (2010.01) |
| H01L 33/44 | (2010.01) |

(52) U.S. Cl.
CPC ....... *H01L 33/505* (2013.01); *H01L 2933/0066* (2013.01); *H01L 33/64* (2013.01); *H01L 2933/0041* (2013.01); *H01L 33/44* (2013.01)
USPC .......................................................... 257/99

(58) Field of Classification Search
CPC ......... H01L 33/32; H01L 33/60; H01L 33/38; H01L 33/486; H01L 2924/01079; H01L 33/33; H01L 33/64; H01L 2933/0041
USPC .............. 257/79, 81–82, 84, 86, 94, E51.018, 257/706
See application file for complete search history.

(56) References Cited

U.S. PATENT DOCUMENTS

| | | | |
|---|---|---|---|
| 3,780,357 A | 12/1973 | Haitz | |
| 4,576,796 A | 3/1986 | McCormick | |
| 5,766,987 A | 6/1998 | Mitchell et al. | ............... 438/126 |
| 5,813,753 A | 9/1998 | Vriens et al. | |

(Continued)

FOREIGN PATENT DOCUMENTS

| | | |
|---|---|---|
| CN | 2310925 | 3/1999 |
| CN | 2310925 Y | 3/1999 |

(Continued)

OTHER PUBLICATIONS

Nichia Corp. White LED, Part No. NSPW312BS. Specification for Nichia White LED, Model NSPW312BS, Jan. 14, 2004.

(Continued)

*Primary Examiner* — Hoa B Trinh
(74) *Attorney, Agent, or Firm* — Koppel, Patrick, Heybl & Philpott

(57) ABSTRACT

Methods for fabricating light emitting diode (LED) chips one of which comprises flip-chip mounting a plurality of LEDs on a surface of a submount wafer and forming a coating over said LEDs. The coating comprising a conversion material at least partially covering the LEDs. The coating is planarized to the desired thickness with the coating being continuous and unobstructed on the top surface of the LEDs. The LEDs chips are then singulated from the submount wafer. An LED chip comprising a lateral geometry LED having first and second contacts, with the LED flip-chip mounted to a submount by a conductive bonding material. A phosphor loaded binder coats and at least partially covers the LED. The binder provides a substantially continuous and unobstructed coating over the LED. The phosphor within the coating absorbs and converts the wavelength of at least some of the LED light with the coating planarized to achieve the desired emission color point of the LED chip.

28 Claims, 7 Drawing Sheets

(56) References Cited

U.S. PATENT DOCUMENTS

| | | | |
|---|---|---|---|
| 5,849,354 A | 12/1998 | Tsuchiyama | 427/73 |
| 5,923,053 A | 7/1999 | Jakowetz et al. | 257/95 |
| 5,959,316 A | 9/1999 | Lowery | 257/98 |
| 6,056,421 A | 5/2000 | Johnson et al. | |
| 6,066,861 A | 5/2000 | Hohn et al. | |
| 6,153,448 A | 11/2000 | Takahashi et al. | |
| 6,157,086 A | 12/2000 | Weber | 257/788 |
| 6,252,254 B1 | 6/2001 | Soules et al. | 257/89 |
| 6,257,737 B1 | 7/2001 | Marshall et al. | |
| 6,274,890 B1 | 8/2001 | Oshio et al. | |
| 6,329,224 B1 | 12/2001 | Nguyen | |
| 6,333,522 B1 | 12/2001 | Inoue et al. | 257/99 |
| 6,366,018 B1 | 4/2002 | Garbuzov et al. | |
| 6,468,832 B1 | 10/2002 | Mostafazadeh | 438/112 |
| 6,501,100 B1 | 12/2002 | Srivastava | |
| 6,504,180 B1 | 1/2003 | Heremans et al. | |
| 6,522,065 B1 | 2/2003 | Srivastava | |
| 6,580,097 B1 | 6/2003 | Soules et al. | |
| 6,650,044 B1 | 11/2003 | Lowery | 313/502 |
| 6,653,765 B1 | 11/2003 | Levinson et al. | |
| 6,664,560 B2 | 12/2003 | Emerson et al. | |
| 6,686,676 B2 | 2/2004 | McNulty | |
| 6,734,033 B2 | 5/2004 | Emerson et al. | |
| 6,791,259 B1 | 9/2004 | Stokes | |
| 6,924,233 B1 | 8/2005 | Chua et al. | |
| 6,936,862 B1 | 8/2005 | Chang et al. | |
| 6,939,481 B2 | 9/2005 | Srivastava | |
| 6,967,116 B2 | 11/2005 | Negley | |
| 7,023,019 B2 | 4/2006 | Maeda et al. | |
| 7,042,020 B2 | 5/2006 | Negley | |
| 7,078,737 B2 | 7/2006 | Yuri | |
| 7,183,586 B2 | 2/2007 | Ichihara | |
| 7,246,923 B2 | 7/2007 | Conner | |
| 7,259,402 B2 | 8/2007 | Edmond et al. | |
| 7,286,296 B2 | 10/2007 | Chaves et al. | 359/641 |
| 7,601,550 B2 | 10/2009 | Bogner | |
| 8,610,145 B2 * | 12/2013 | Yano | 257/98 |
| 2001/0000622 A1 | 5/2001 | Reeh et al. | |
| 2001/0007484 A1 | 7/2001 | Sakamaki | 349/2 |
| 2001/0015442 A1 | 8/2001 | Kondoh et al. | 257/79 |
| 2001/0019780 A1 | 9/2001 | Sugihara | 257/780 |
| 2001/0038166 A1 | 11/2001 | Weber | 264/272 |
| 2002/0001869 A1 | 1/2002 | Fjelstad | |
| 2002/0048905 A1 | 4/2002 | Ikegami et al. | 438/464 |
| 2002/0056847 A1 | 5/2002 | Uemura et al. | |
| 2002/0063520 A1 | 5/2002 | Yu et al. | |
| 2002/0158578 A1 | 10/2002 | Eliashevich et al. | 313/512 |
| 2003/0038596 A1 | 2/2003 | Ho | |
| 2003/0079989 A1 | 5/2003 | Klocke et al. | |
| 2003/0121511 A1 | 7/2003 | Hashimura et al. | |
| 2003/0181122 A1 | 9/2003 | Collins et al. | 445/24 |
| 2004/0012958 A1 | 1/2004 | Hashimoto | |
| 2004/0041159 A1 | 3/2004 | Yuri et al. | |
| 2004/0056260 A1 | 3/2004 | Slater et al. | 257/79 |
| 2004/0061115 A1 | 4/2004 | Kozawa et al. | |
| 2004/0061433 A1 | 4/2004 | Izuno et al. | 313/498 |
| 2004/0124429 A1 | 7/2004 | Stokes | |
| 2004/0140765 A1 | 7/2004 | Takekuma | |
| 2004/0164307 A1 | 8/2004 | Mueller-Mach et al. | |
| 2004/0164311 A1 | 8/2004 | Uemura | |
| 2004/0170018 A1 | 9/2004 | Nawashiro | |
| 2004/0173806 A1 | 9/2004 | Chua | |
| 2004/0180475 A1 | 9/2004 | Shibata et al. | 438/127 |
| 2004/0188697 A1 | 9/2004 | Brunner et al. | |
| 2004/0245530 A1 | 12/2004 | Kameyama | |
| 2004/0256974 A1 | 12/2004 | Mueller-Mach et al. | |
| 2005/0001225 A1 * | 1/2005 | Yoshimura et al. | 257/98 |
| 2005/0021191 A1 | 1/2005 | Taniguchi et al. | |
| 2005/0062140 A1 | 3/2005 | Leung et al. | |
| 2005/0080193 A1 | 4/2005 | Woulters et al. | 525/191 |
| 2005/0093004 A1 * | 5/2005 | Yoo | 257/79 |
| 2005/0122031 A1 | 6/2005 | Itai | |
| 2005/0145991 A1 | 7/2005 | Sakamoto et al. | |
| 2005/0167682 A1 | 8/2005 | Fukasawa | |
| 2005/0184305 A1 | 8/2005 | Ueda | |
| 2005/0184638 A1 | 8/2005 | Mueller | |
| 2005/0194606 A1 | 9/2005 | Oohata | 257/99 |
| 2005/0196886 A1 | 9/2005 | Jager et al. | |
| 2005/0219835 A1 | 10/2005 | Nagayama | |
| 2005/0221519 A1 | 10/2005 | Leung et al. | |
| 2005/0243237 A1 | 11/2005 | Sasuga | |
| 2005/0259423 A1 | 11/2005 | Heuser et al. | 362/293 |
| 2005/0265404 A1 | 12/2005 | Ashdown | |
| 2006/0001046 A1 | 1/2006 | Batres et al. | |
| 2006/0003477 A1 | 1/2006 | Braune et al. | 438/29 |
| 2006/0010466 A1 | 1/2006 | Batres et al. | |
| 2006/0027820 A1 | 2/2006 | Cao | 257/89 |
| 2006/0060867 A1 | 3/2006 | Suehiro | |
| 2006/0060872 A1 | 3/2006 | Edmond et al. | |
| 2006/0060874 A1 | 3/2006 | Edmond et al. | |
| 2006/0060879 A1 | 3/2006 | Edmond et al. | |
| 2006/0065906 A1 | 3/2006 | Harada | |
| 2006/0091788 A1 | 5/2006 | Yan | |
| 2006/0102991 A1 | 5/2006 | Sakano | |
| 2006/0124947 A1 | 6/2006 | Mueller et al. | 257/98 |
| 2006/0138937 A1 | 6/2006 | Ibbetson | |
| 2006/0145170 A1 | 7/2006 | Cho | 257/95 |
| 2006/0157721 A1 | 7/2006 | Tran et al. | |
| 2006/0189098 A1 | 8/2006 | Edmond | |
| 2006/0267042 A1 | 11/2006 | Izuno | |
| 2006/0284195 A1 | 12/2006 | Nagai | |
| 2007/0012940 A1 | 1/2007 | Suh et al. | |
| 2007/0034995 A1 | 2/2007 | Kameyama | |
| 2007/0037307 A1 | 2/2007 | Donofrio | |
| 2007/0092636 A1 | 4/2007 | Thompson et al. | |
| 2007/0114559 A1 | 5/2007 | Sayers et al. | 257/100 |
| 2007/0138941 A1 | 6/2007 | Jin et al. | 313/503 |
| 2007/0158668 A1 | 7/2007 | Tarsa et al. | |
| 2007/0158669 A1 | 7/2007 | Lee et al. | |
| 2007/0215890 A1 | 9/2007 | Harbers | |
| 2007/0259206 A1 | 11/2007 | Oshio | |
| 2008/0006815 A1 | 1/2008 | Wang et al. | |
| 2008/0149945 A1 | 6/2008 | Nagai | |
| 2008/0203410 A1 | 8/2008 | Brunner et al. | |
| 2008/0283865 A1 | 11/2008 | Yoo | |
| 2009/0268461 A1 | 10/2009 | Deak et al. | |

FOREIGN PATENT DOCUMENTS

| | | |
|---|---|---|
| CN | 2310925 Y | 9/1999 |
| CN | 1372330 A | 10/2002 |
| CN | 1455960 | 11/2003 |
| CN | 1476050 | 2/2004 |
| CN | 1547265 | 11/2004 |
| CN | 1866561 A | 11/2006 |
| DE | 19638667 | 4/1998 |
| DE | 19945672 A1 | 4/2000 |
| DE | 69702929 | 2/2001 |
| DE | 102005000800 | 8/2005 |
| DE | 102005013265 | 12/2005 |
| DE | 102005042814 | 4/2006 |
| DE | 102005062414 | 3/2007 |
| DE | 102005058127 | 6/2007 |
| DE | 102007022090 | 11/2008 |
| EP | 0732740 A2 | 9/1996 |
| EP | 1017112 | 7/2000 |
| EP | 1 059 678 A | 12/2000 |
| EP | 1 138 747 A2 | 10/2001 |
| EP | 1198016 A2 | 10/2001 |
| EP | 1198005 A1 | 4/2002 |
| EP | 1198016 A2 | 4/2002 |
| EP | 1367655 A1 | 3/2003 |
| EP | 1 367 655 | 12/2003 |
| EP | 1385215 A2 | 1/2004 |
| EP | 1601030 A2 | 11/2005 |
| EP | 1724848 A | 11/2006 |
| EP | 1724848 A2 | 11/2006 |
| EP | 1935452 A1 | 6/2008 |
| FR | 2704690 | 11/1994 |
| FR | 2704690 A | 11/1994 |
| JP | 02-086150 | 3/1990 |
| JP | 402086150 | 3/1990 |
| JP | 4233454 | 8/1992 |
| JP | H10107325 | 4/1998 |

(56) References Cited

FOREIGN PATENT DOCUMENTS

| | | |
|---|---|---|
| JP | 10-163525 | 6/1998 |
| JP | 10163525 | 6/1998 |
| JP | 10163525 A | 6/1998 |
| JP | 10247750 A | 9/1998 |
| JP | 10261821 A | 9/1998 |
| JP | H0261821 | 9/1998 |
| JP | 11276932 | 10/1999 |
| JP | 2002101147 | 4/2000 |
| JP | 2000-164937 | 6/2000 |
| JP | 2000164930 | 6/2000 |
| JP | 2000164937 | 6/2000 |
| JP | 2000208820 | 7/2000 |
| JP | 2000243728 | 8/2000 |
| JP | 2000277551 A | 10/2000 |
| JP | 2000-349346 | 12/2000 |
| JP | 2000349346 | 12/2000 |
| JP | 2001308116 A | 11/2001 |
| JP | 2001345480 | 12/2001 |
| JP | 2002-050799 | 2/2002 |
| JP | 2002-50799 A | 2/2002 |
| JP | 2002-050799 A | 2/2002 |
| JP | 200250799 | 2/2002 |
| JP | 2002050799 | 2/2002 |
| JP | 2002-076446 | 3/2002 |
| JP | 2002-093830 | 3/2002 |
| JP | 2002076445 | 3/2002 |
| JP | 2002-118293 | 4/2002 |
| JP | 2002118293 | 4/2002 |
| JP | 2002118293 A | 4/2002 |
| JP | 2002-531955 | 9/2002 |
| JP | 2002-531956 | 9/2002 |
| JP | 2002280607 | 9/2002 |
| JP | 2002319704 | 10/2002 |
| JP | 2002374006 | 12/2002 |
| JP | 2003-007929 | 1/2003 |
| JP | 2003007929 A | 1/2003 |
| JP | 2003007929 | 1/2003 |
| JP | 2003046141 | 2/2003 |
| JP | 2003-115614 | 4/2003 |
| JP | 2003110153 | 4/2003 |
| JP | 2003115614 | 4/2003 |
| JP | 2003-170465 | 6/2003 |
| JP | 2003-197655 | 7/2003 |
| JP | 2003224307 | 8/2003 |
| JP | 2003234511 | 8/2003 |
| JP | 2003-258011 | 9/2003 |
| JP | 2003-526212 | 9/2003 |
| JP | 2003-318448 | 11/2003 |
| JP | 2003-533852 | 11/2003 |
| JP | 2004-031856 | 1/2004 |
| JP | 2004-501512 | 1/2004 |
| JP | 2004031856 | 1/2004 |
| JP | 2004095765 | 3/2004 |
| JP | 2004134699 | 4/2004 |
| JP | 2004186488 | 7/2004 |
| JP | 2004-266240 | 9/2004 |
| JP | 2004266240 | 9/2004 |
| JP | 3589187 B2 | 11/2004 |
| JP | 2004-363342 | 12/2004 |
| JP | 2004363342 | 12/2004 |
| JP | 2005064113 | 3/2005 |
| JP | 2005167079 | 6/2005 |
| JP | 2005-252222 | 9/2005 |
| JP | 2005252222 | 9/2005 |
| JP | 2005-298817 | 10/2005 |
| JP | 2006-054209 | 2/2006 |
| JP | 2006032387 | 2/2006 |
| JP | 20060495533 | 2/2006 |
| JP | 2006080565 | 3/2006 |
| JP | 2006114637 | 4/2006 |
| JP | 2006165416 | 6/2006 |
| JP | 2006245020 | 6/2006 |
| JP | 2006-245020 | 9/2006 |
| JP | 2006-253370 | 9/2006 |
| JP | 2006253370 | 9/2006 |
| JP | 2006313886 | 11/2006 |
| JP | 2007063538 | 3/2007 |
| JP | 2008-129043 | 6/2008 |
| JP | 2008532281 | 8/2008 |
| JP | 2008-218511 | 9/2008 |
| JP | 2000-299334 | 10/2010 |
| KR | 200412776 | 2/2004 |
| KR | 2004-0017926 | 3/2004 |
| KR | 200417926 | 3/2004 |
| KR | 200429313 | 4/2004 |
| TW | 522423 | 3/2003 |
| TW | 595012 | 6/2004 |
| WO | WO 00/33390 | 6/2000 |
| WO | WO 0124283 A1 | 4/2001 |
| WO | WO 0124283 A | 5/2001 |
| WO | WO 03/021668 A1 | 3/2003 |
| WO | WO 03001612 | 3/2003 |
| WO | WO 03021691 A1 | 3/2003 |
| WO | WO 2004020704 | 3/2004 |
| WO | WO 2005101445 A1 | 10/2005 |
| WO | WO 2006/065015 | 6/2006 |
| WO | WO 2006135496 A2 | 12/2006 |
| WO | WO 2005121641 A1 | 9/2007 |
| WO | WO 2007107903 A1 | 9/2007 |
| WO | WO 2007136956 | 11/2007 |
| WO | WO 2008003176 A1 | 1/2008 |
| WO | WO 2009060356 A2 | 5/2009 |
| WO | WO 2010035171 A2 | 4/2010 |

OTHER PUBLICATIONS

Nichia Corp. White LED, Part No. NSPW300BS. Specification for Nichia White LED, Model NSPW300BS, Jan. 14, 2004.
PCT International Search Report and Written Opinion, PCT/US2007/024366,Date: Jul. 15, 2008.
Official Notice of Rejection Mailed Jul. 29, 2008, Japanese Patent Application No. 2007-533459.
Patent Abstracts of Japan 2004-221185 Aug. 5, 2004.
Patent Abstracts of Japan 11-040858, Feb. 12, 1999.
Patent Abstract of Japan 2001-181613, Jul. 3, 2001.
Office Action re related U.S. Appl. No. 10/666,399, dated: Sep. 5, 2008.
International Search Report for PCT/US2007/024367, Dated: Oct. 22, 2008.
Official Notice of Rejection re related Japanese Patent Application No. 2007-533459, Dated: Jul. 29, 2008.
Patent Abstracts of Japan, Pub. No. 2001-181613,Date: Jul. 3, 2001.
Patent Abstracts of Japan, Pub. No. 11-040858, Date: Feb. 12, 1999.
Patent Abstracts of Japan, Pub. No. 2004-221185, Date: Aug. 5, 2004.
Official Notice of Final Decision of Rejection re: related Japanese Patent Application No. 2007-533459, dated: Dec. 26, 2008.
Rejection Decision re: related Chinese Patent Application No. 200580031382.3, dated: Feb. 2, 2009.
Communication pursuant to Article 94(3) EPC re: related European Application No. 05808825.3, dated: Feb. 18, 2009.
Japanese Publication No. JP2005033138(A), Date: Feb. 3, 2005 to Shoji Iwao;Fujisawa Shigeo.
Notice on Reexamination for Chinese Patent Application No. 200580031382.3 mailed May 28, 2010.
Patent Abstracts of Japan No. 2002-050799 dated Feb. 15, 2002 to Stanley Electric Co. Ltd.
From related application. Japanese Patent Application No. 2006-526964, Official Notice of Rejection, mailed Feb. 16, 2010.
Patent Abstracts of Japan, Publication No. 2003-258011 dated Sep. 12, 2003.
Patent Abstracts of Japan, Publication No. 2002-093830 dated Mar. 29, 2002.
Office Action from related U.S. Appl. No. 11/982,276, dated Dec. 7, 2009.
Office Action from related U.S. Appl. No. 12/077,638, dated; Dec. 8, 2009.
Communication pursuant to Article 94(3) EPC re: related European Application No. 05808826.3, dated: Feb. 18, 2009.
International Search Report and Written Opinion from related PCT Application No. PCT/US2009/001572, dated: Jul. 17, 2009.

(56) References Cited

OTHER PUBLICATIONS

First Office Action for European Patent Application No. 07754163.9 dated Feb. 28, 2011.
Notice of Rejection (Final) in Japanese Patent Application No. 2006-526964 dated Feb. 22, 2011.
Minutes of Oral Proceedings (EPO Form 2009) in European Patent Application No. 05808825.3 dated Feb. 3, 2011.
Summons to Attend Oral Proceedings in European Patent Application No. 05808825.3 dated Feb. 3, 2011.
Office Action from Japanese Patent Application No. 2007-533459 (Appeal No. 2009-006588) mailed Jul. 16, 2010.
Office Action from Chinese Patent Application No. 200780012387.0 mailed Jun. 30, 2010.
Summons for Oral Proceedings for European Patent Application No. 05808825.3 dated Sep. 9, 2010.
Notification of the First Office Action for Chinese Patent Application No. 200780050127.2 mailed Aug. 8, 2010.
Notice of Rejection for Japanese Patent Application No. 2006-526964 issued Oct. 5, 2010.
Notification of the First Office Action for Chinese Patent Application No. 200780050197.8 dated Sep. 9, 2010.
Reexamination Decision No. 27346 for Chinese Patent Application No. 200580031382.3 dated Oct. 27, 2010.
Response to Office Action U.S. Appl. No. 12/077,638, OA dated Jul. 7, 2012, Resp. filed Aug. 30, 2010.
Response to Office Action U.S. Appl. No. 11/656,759, OA dated Nov. 25, 2009, Resp. filed Apr. 26, 2010.
Office Action from U.S. Appl. No. 11/656,759, dated Nov. 25, 2009.
Response to Office Action U.S. Appl. No. 10/666,399, OA dated Dec. 22, 2009, Reap. filed Mar. 22, 2010.
Office Action from U.S. Appl. No. 11/881,683, dated Oct. 14, 2010.
Office Action from U.S. Appl. No. 11/899,790, dated Mar. 21, 2011.
Office Action from U.S. Appl. No. 11/982,276, dated Mar. 25, 2010.
Office Action from U.S. Appl. No. 11/398,214, dated Dec. 11, 2009.
Notice of Allowance from U.S. Appl. No. 10/666,399, dated Oct. 14, 2010.
Office Action from U.S. Appl. No. 12/506,989, dated Jul. 23, 2010.
Office Action from U.S. Appl. No. 10/666,399, dated Dec. 22, 2009.
Office Action from U.S. Appl. No. 12/506,989, dated Mar. 8, 2011.
Office Action from U.S. Appl. No. 11/827,626, dated Apr. 1, 2011.
Office Action from U.S. Appl. No. 11/595,720, dated May 14, 2010.
Office Action from U.S. Appl. No. 11/827,626, dated Oct. 7, 2010.
Office Action from U.S. Appl. No. 11/881,683, dated May 12, 2010.
Office Action from U.S. Appl. No. 11/899,790, dated Jun. 2, 2010.
Office Action from U.S. Appl. No. 12/077,638, dated Sep. 22, 2010.
Office Action from U.S. Appl. No. 11/982,276, dated Aug. 19, 2010.
Office Action from U.S. Appl. No. 12/077,638, dated Jul. 7, 2010.
Office Action from U.S. Appl. No. 10/666,399, dated May 11, 2010.
Response to OA from U.S. Appl. No. 12/077,638, OA dated Dec. 8, 2009, filed Feb. 26, 2010.
Response to OA from U.S. Appl. No. 11/982,276, OA dated Dec. 7, 2009, filed Feb. 5, 2010.
Response to OA from U.S. Appl. No. 11/982,276, OA dated Aug. 19, 2010, filed Nov. 2, 2010.
Office Action from U.S. Appl. No. 11/982,276, dated Feb. 18, 2010.
Office Action from U.S. Appl. No. 11/398,214, dated Nov. 12, 2010.
Office Action from U.S. Appl. No. 11/656,759, dated May 21, 2010.
Office Action from U.S. Appl. No. 11/656,759, dated Mar. 9, 2011.
Office Action from U.S. Appl. No. 12/077,638, dated Dec. 21, 2010.
Response to OA from U.S. Appl. No. 11/595,720, dated May 14, 2010, filed Jul. 6, 2010.
Response to Office Action U.S. Appl. No 11/899,790, OA dated Jun. 2, 2010, Resp. filed Nov. 1, 2010.
Response to Office Action U.S. Appl. No 11/398,214, OA dated Dec. 11, 2009, Resp. filed Mar. 2, 2010.
Response to Office Action U.S. Appl. No 10/666,399, OA dated May 11, 2010, Reap. filed Aug. 11, 2010.
Response to Office Action U.S. Appl. No. 12/008,477, OA dated Mar. 1, 2010, Resp. filed May 26, 2010.
Response to Office Action U.S. Appl. No. 11/982,276, OA dated Mar. 25, 2010, Resp. filed Jun. 21, 2010.
Response to Office Action U.S. Appl. No. 11/881,683, OA dated May 12, 2010, Resp. filed Aug. 3, 2010.
Office Action U.S. Appl. No. 11/899,790, mailed Jul. 27, 2011.
Response to Office Action U.S. Appl. No. 11/899,790, filed Nov. 22, 2011.
Office Action U.S. Appl. No. 12/506,989, mailed on Jul. 20, 2011.
Response to Office Action U.S. Appl. No. 12/506,989, filed Nov. 21, 2011.
Office Action U.S. Appl. No. 12/287,764, mailed Jul. 30, 2010.
Response to Office Action U.S. Appl. No. 12/287,764, filed Nov. 30, 2010.
Office Action U.S. Appl. No. 11/956,989, mailed Apr. 16, 2010.
Response to Office Action U.S. Appl. No. 11/956,989, filed Jun. 14, 2010.
Response to Office Action U.S. Appl. No. 11/956,989, filed Jul. 14, 2010.
Office Action U.S. Appl. No. 12/287,764, mailed Mar. 25, 2010.
Response to Office Action U.S. Appl. No. 12/287,764, filed Jul. 21, 2010.
Office Action U.S. Appl. No. 12/287,764, mailed May 17, 2011.
Response to Office Action U.S. Appl. No. 12/287,764, filed Oct. 10, 2011.
Office Action U.S. Appl. No. 13/072,371, mailed Oct. 5, 2011.
Response to Office Action U.S. Appl. No. 13/072,371, filed Dec. 23, 2011.
Office Action U.S. Appl. No. 11/656,759, mailed Sep. 23, 2011.
Response to Office Action U.S. Appl. No. 11/656,759, filed Jan. 16, 2012.
Office Action U.S. Appl. No. 12/862,640, mailed Aug. 19, 2011.
Response to Office Action U.S. Appl. No. 12/862,640, filed Feb. 21, 2012.
Office Action U.S. Appl. No. 12/287,764, mailed Oct. 26, 2011.
Response to Office Action Application U.S. Appl. No. 12/287,764, filed Mar. 6, 2012.
Office Action U.S. Appl. No. 12/506,989, mailed Dec. 27, 2011.
Office Action U.S. Appl. No. 11/899,790, mailed Jan. 12, 2012.
Response to Office Action U.S. Appl. No. 11/899,790, filed Mar. 8, 2012.
Office Action U.S. Appl. No. 12/862,640, mailed Mar. 9, 2012.
Office Action U.S. Appl. No. 12/287,764, mailed Jan. 13, 2011.
Response to Office Action U.S. Appl. No. 12/287,764, filed May 5, 2011.
Office Action from Taiwan Patent Application No. 093128231 issued Apr. 21, 2011.
Second Office Action for Chinese Patent Application No. 200780050127.2 dated Jun. 15, 2011.
International Preliminary Examination Report for PCT Application No. PCT/US07/24366 mailed Jun. 29, 2011.
International Preliminary Examination Report for PCT Application No. PCT/US07/24367 mailed Jun. 29, 2011.
Decision to Refuse a European Patent Application regarding EP 05 808 825.3 dated Jun. 14, 2011.
Office Action for Korean Patent Application No. 10-2007-7008694 dated Aug. 7, 2011.
Notice of Rejection of Japanese Patent Application No. 2006-526964 issued Sep. 13, 2011.
Notification of Reasons for Rejection for Japanese Patent Application No. 2009-547219 dated Sep. 16, 2011.
Notification of Reasons for Rejection for Japanese Patent Application No. 2009-547218 dated Sep. 16, 2011.
Notice of Reasons for Rejection for Japanese Patent Application No. 2008-317576 dated Sep. 13, 2011.
Notification of the First Office Action for Chinese Patent Application No. CN 201110029365.3 mailed Jan. 4, 2012.
International Search Report and Written Opinion from Application No. PCT/US2011/001214, dated Mar. 21, 2012.
Notification of the First Office Action, Chinese Patent Application No. 201010279016.2. dated: Feb. 28, 2012.
Office Action from U.S. Appl. No. 13/072,371, dated: Mar. 29, 2012.
Examination Report for European Application No. 04 783 941.0-2203, dated Mar. 22, 2012.

(56) References Cited

OTHER PUBLICATIONS

Notification of First Office Action from Chinese Application No. 201010279016.21, dated Feb. 28, 2012.
Notification of the Third Office Action from Chinese Application No. 200780050127.2, dated Mar. 28, 2012.
Decision of Rejection from Japanese Application No. 2009-547218. dated Mar. 8, 2012.
Decision of Rejection from Japanese Application No. 2009-547219. dated Mar. 8, 2012.
Extended European Search Report Application No. 10012027.8-2203/2306526, Mar. 30, 2012.
Office Action for Taiwan Patent Application No. 094122646, Feb. 20, 2012.
Examination Report for European Application No. 08 171 399.2-2222. Mar. 26, 2012.
Notification of Reasons for Rejection for Japanese Patent Appl. No 2011-279356, dated Jan. 23, 2013.
Office Action from Japanese Office Action, Application No. 2011-224055, dated Feb. 7, 2013.
Rejection Decision from Chinese Patent Appl. No. 201010279016.2, dated Jun. 21, 2013.
Examination Report from European Patent Appl. No. 04 783 941.0-1555, dated Jul. 25, 2013.
Rejection Decision from Taiwanese Patent Appl. No. 094122646, dated Dec. 14, 2012.
Decision of Rejection from Japanese Patent Appl. No. 2008-317576. dated Dec. 18, 2012.
Decision of Rejection from Japanese Patent Appl. No. 2006-526964, dated Dec. 18, 2012.
Second Office Action from Chinese Patent Application No. 20101029016.2. dated Dec. 24, 2012.
Official Action from European Patent Application No. 07874432.3. dated Nov. 13, 2012.
Official Action from European Patent Application No. 07840092.6, dated Nov. 13, 2012.
Notice of Results of Re-Consideration Prior to Appeal from Korean Patent Application No. 10-2007-7008694, dated Sep. 21, 2012.
Rejection Decision for Chinese Patent Application No. 201110029365.3, dated Sep. 10, 2012.
Noting of Loss of Rights from European Application No. 04783941.0-2203/1665361. dated Nov. 6, 2012.
Office Action from U.S. Appl. No. 13/072,371, dated Mar. 29, 2012.
Response to OA from U.S. Appl. No. 13/072,371, filed May 16, 2012.
Office Action from U.S. Appl. No. 11/656,759, dated May 1, 2012.
Response to OA from U.S. Appl. No. 11/656,759, filed Jun. 26, 2012.
Office Action from U.S. Appl. No. 12/862,640, dated Jun. 29, 2012.
Response to OA from U.S. Appl. No. 12/862,640, filed Sep. 20, 2012.
Office Action from U.S. Appl. No. 12/506,989, dated Jul. 6, 2012.
Response to OA from U.S. Appl. No. 12/506,989, filed Oct. 11, 2012.
Office Action from U.S. Appl. No. 13/072,371, dated Jul. 23, 2012.
Response to OA from U.S. Appl. No. 13/072,371, filed Oct. 17, 2012.
Office Action from U.S. Appl. No. 12/842,639, dated Aug. 14, 2012.
Response to OA from U.S. Appl. No, 12/842,639, filed Nov. 9, 2012.
Office Action from U.S. Appl. No. 12/862,640, dated Oct. 2, 2012.
Response to OA from U.S. Appl. No. 12/852,640, filed Apr. 17, 2013.
Office Action from U.S. Appl. No. 12/506,989, dated Oct. 24, 2012.
Response to OA from U.S. Appl. No. 12/506,989, filed Dec. 4, 2012.
Office Action from U.S. Appl. No. 11/899,790, dated Dec. 5, 2012.
Response to OA from U.S. Appl. No. 11/899,790, filed Feb. 27, 2013.
Office Action from U.S. Appl. No. 12/506,989, dated Jan. 18, 2013.
Response to OA from U.S. Appl. No. 12/506,989, filed Apr. 18, 2013.
Office Action from U.S. Appl. No. 12/862,640, dated Jan. 24, 2013.
Office Action from U.S. Appl. No. 13/072,371, dated Jan. 30, 2013.
Response to OA from U.S. Appl. No. 13/072,371, filed Apr. 22, 2013.
Office Action from U.S. Appl. No. 11/656,759, dated Feb. 13, 2013.
Response to OA from U.S. Appl. No. 11/656,759, filed May 13, 2013.
Office Action from U.S. Appl. No. 11/656,759. dated Jul. 2, 2013.
Response to OA from U.S. Appl. No. 11/656,759, filed Aug. 21, 2013.

Office Action from U.S. Appl. No. 11/899,790. dated May 1, 2013.
Response to OA from U.S. Appl. No. 11/899,790, filed Jun. 18, 2013.
Office Action from U.S. Appl. No. 13/072,371, dated Apr. 30, 2013.
Office Action from U.S. Appl. No. 12/862,640, dated Apr. 30, 2013.
Office Action from U.S. Appl. No. 12/842,639, dated Mar. 7, 2013.
Response to OA from U.S. Appl. No. 12/842,639, filed Jun. 5, 2013.
Interrogation from Japanese Patent Appl. No. 2008-317576. dated Jul. 9, 2013.
Decision of Final Rejection from Japanese Patent Appl. No. 2011-224055, dated Jul. 26, 2013.
Decision of Rejection from Japanese Patent appl. No. 2011-279356, dated Jul. 31, 2013.
Notice of Rejection from Japanese Patent Appl. No. 2008-527912. dated Jun. 5, 2013.
Notice of Rejection from Japanese Patent Appl. No. 2008-527912 issued Jun. 14, 2011.
International Preliminary Report on Patentability from Appl. No. PCT/US06/24884 dated: Jun. 12, 2008.
Nichia Corp. White LED, Part No. NSPW312BX. "Specification for Nichia White LED, Model NSW312BS". pp. 1-14, 2004.
Nichia Corp. White LED, Part No. NSPW300BS, Specifications for Nichia White LED, Model NSPW300BS, pp. 1-14, 2004.
Office Action from Japanese Patent Appl. No. 2007-216808. mailed Sep. 6, 2010.
Office Action from Japanese Patent Appl. No. 2011-224055, Jan. 12, 2012.
Decision of Final Rejection from Japanese Patent Appl. No. 2007-216808, dated Jan. 1, 2011.
Office Action from German Patent Appl. No. 10 2007 040 841.4-33, dated Sep. 17, 2009.
Office Action from German Patent Appl. No. 10 2007 040 811.2, dated Sep. 17, 2009.
Office Action from Chinese Patent Appl. No 20070148326.9. dated Jun. 19, 2009. 2 pages.
Schubert, "Light-Emitting Diodes", Cambridge University Press, 2003, pp. 92-96.
First Office Action and Search Report from Chinese Patent Application No. 201210030627.2. dated Dec. 3, 2012.
Office Action (Brief Description of) from Chinese Patent Appl. No. 201010279016.2, dated Jan. 10, 2014.
IPT's Decision from Korean Patent Appl. No. 10-2007-7008694, dated Dec. 24, 2013.
Office Action from U.S. Appl. No. 12/862,640, dated Dec. 20, 2013.
Office Action from U.S. Appl. No. 11/656,759, dated Nov. 18, 2013.
Notice of Allowance from Korean Patent Appl. No. 10-2009-7017405. dated: Feb. 18, 2014.
Search Report from Taiwanese Patent appl No. 096143968. dated: Feb. 17, 2014.
Office Action from U.S. Appl. No. 12/506,989, dated Sep. 5, 2013.
Office Action from U.S. Appl. No. 11/899,790, dated Sep. 17, 2013.
Office Action from Korean Patent Appl. No. 10-2009-7017405, dated Oct. 23, 2013.
Appeal Decision to Grant a Patent from Japanese Patent No. 2007-506279. dated Oct. 28, 2013.
Office Action from U.S. Appl. No. 13/072,371, dated Nov. 8, 2013.
Decision of Rejection from Japanese Patent Appl. No. 2012-026327, dated Apr. 8, 2014.
Brief Summary of Rejection Decision from Chinese Patent Appl. No 201010279016.2 dated Apr. 22, 2014.
Preliminary Report from Japanese Patent Appl. No. 2013-020955 dated Dec. 26, 2013 (received May 8, 2014).
Preliminary Report from Japanese Patent Appl. No. 2013-024242 dated Feb. 26, 2014 (received May 8, 2014).
Office Action from Korean Patent Appl. No. 10-2009-7017407, dated Apr. 28, 2014.
Notification of Reexamination from Chinese Patent appl. No. 201110029365.3 dated May 7, 2014.
Office Action from U.S. Appl. No. 13/429,053, dated Apr. 11, 2014.
Office Action from U.S. Appl. No. 13/072,371, dated Apr. 29, 2014.
Office Action from U.S. Appl. No. 11/656,759. dated May 27, 2014.
Examination from European Appl. No. 04 783 941.0-1552. dated Mar. 6, 2014.

(56) References Cited

OTHER PUBLICATIONS

Office Action and Search Report from Taiwanese Patent Appl. No. 101130701, dated Feb. 6, 2014.
Search Report from Taiwanese Patent Appl. No. 097110195, dated Mar. 12, 2014.
Office Action from U.S. Appl. No. 11/899,790, dated Feb. 25, 2014.
Office Action from U.S. Appl. No. 12/506,989, dated Feb. 19, 2014.
Decision of Rejection from Japanese Patent appl. No. 2012-02326. dated Apr. 8, 2014.
First Office Action and Search Report from Chinese Patent Appl. No. 2012-10175686.9, dated: Mar. 31, 2014.
Translation of Office Action from Taiwanese Patent Appl. No. 096143968, dated Feb. 13, 2014.
Notification of Reexamination from Chinese Patent Appl. No. 200780050127.2. dated Jun. 3, 2014.
Notification of Allowance from Taiwan Patent Appl. No. 101130701. dated Jul. 15, 2014.
Office Action and Search Report from Taiwan Patent Appl. No. 097110195, dated Jul. 18, 2014.

\* cited by examiner

FIG. 1e
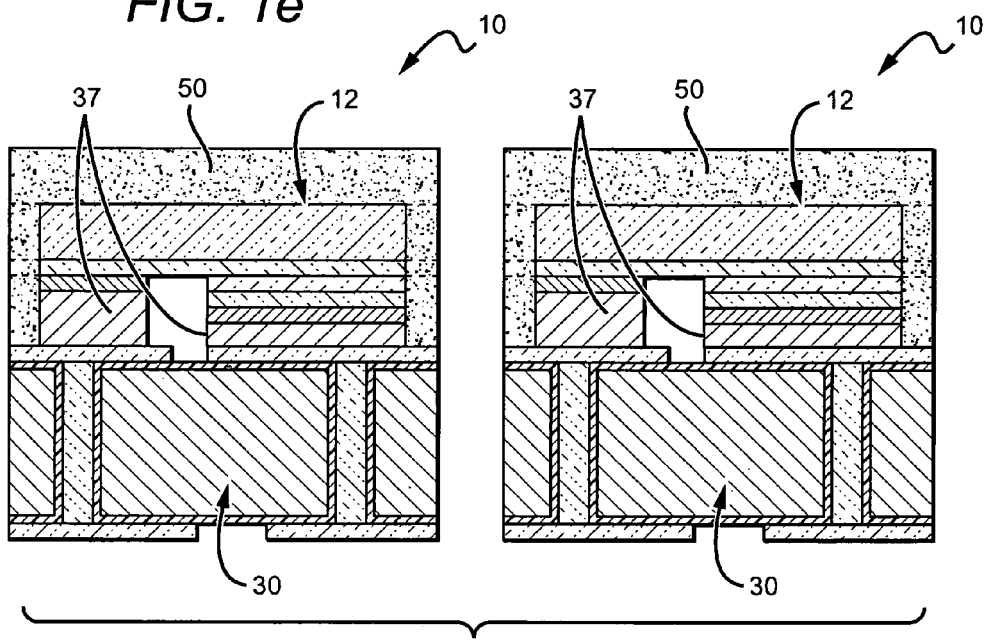
FIG. 2a
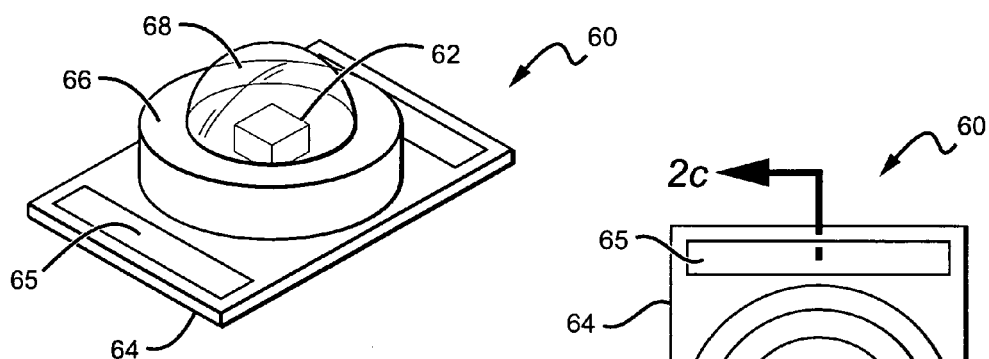
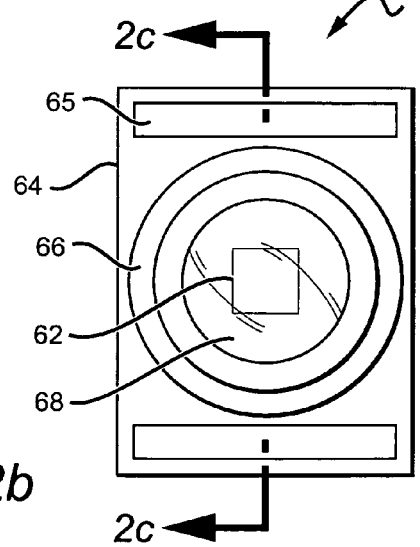
FIG. 2b

FLIP-CHIP PHOSPHOR COATING METHOD AND DEVICES FABRICATED UTILIZING METHOD

BACKGROUND OF THE INVENTION

1. Field of the Invention

This invention relates to methods for fabricating semiconductor devices such as light emitting diodes and light emitting diodes fabricated using the methods.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding phosphor material "downconverts" the wavelength of some of the LED's blue light, changing its color to yellow. Some of the blue light passes through the phosphor without being changed while a substantial portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

One conventional method for coating an LED with a phosphor layer utilizes a syringe or nozzle for injecting a phosphor mixed with epoxy resin or silicone polymers over the LED. Using this method, however, it can be difficult to control the phosphor layer's geometry and thickness. As a result, light emitting from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the syringe method above, using the stencil method can be difficult to control the geometry and layer thickness of the phosphor containing polymer. The stenciling composition may not fully fill the stencil opening such that the resulting layer is not uniform. The phosphor containing composition can also stick to the stencil opening which reduces the amount of composition remaining on the LED. The stencil openings may also be misaligned to the LED. These problems can result in LEDs having non-uniform color temperature and LEDs that are difficult to consistently reproduce with the same or similar emission characteristics.

Various coating processes of LEDs have been considered, including spin coating, spray coating, electrostatic deposition (ESD), and electrophoretic deposition (EPD). Processes such as spin coating or spray coating typically utilize a binder material during the phosphor deposition, while other processes require the addition of a binder immediately following their deposition to stabilize the phosphor particles/powder.

One challenge with these approaches is accessing the wire bond pad on the device after the coating process. Accessing the wire bond by standard wafer fabrication techniques is difficult with typical silicone binding material, as well as other binder materials such as epoxies or glass. Silicones are not compatible with commonly used wafer fabrication materials such as acetone, as well as some developers, and resist strippers. This can limit the options and choices for the particular silicones and process steps. Silicones are also cured at high temperature (greater than 150° C.), which is beyond the glass transition temperature of commonly used photoresists. Cured silicone films with phosphor are also difficult to etch and have a very slow etch rate in chlorine and $CF_4$ plasma, and wet etching of cured silicones is typically inefficient.

SUMMARY OF THE INVENTION

The present invention discloses new methods for fabricating semiconductor devices such as LED chips at the wafer level, and discloses LED chips, LED chip wafers and LED packages that can be fabricated using the methods.

One embodiment of a method for fabricating light emitting diode (LED) chips according to the present invention comprises flip-chip mounting a plurality of LEDs on a surface of a submount wafer and forming a coating over the LEDs, the coating comprising a conversion material at least partially covering the LEDs. The coating is planarized to the desired thickness with the coating being continuous and unobstructed on the top surface of the LEDs. The LEDs chips are then singulated from the submount wafer.

One embodiment of a light emitting diode (LED) chip wafer according to the present invention comprises a submount wafer and a plurality of LEDs having contacts accessible at one side and mounted to the submount wafer so that the contacts are accessible at the submount wafer. A phosphor loaded binder coating is included at least partially covering the LEDs and having substantially the same thickness over each of the LEDs. The coating is also continuous and unobstructed over each of the LEDs, at least some of the light emitted from the LEDs passing through the coating where at least some of the LED light is converted by the phosphor in the coating.

One embodiment of a light emitting diode (LED) chip according to the present invention comprises a lateral geometry LED having first and second contacts, the LED flip-chip mounted to a submount by a conductive bonding material. A phosphor loaded binder coats and at least partially covers the LED. The binder provides a substantially continuous and unobstructed coating over the LED. The phosphor within the coating absorbs and converts the wavelength of at least some of the LED light with the coating planarized to achieve the desired emission color point of the LED chip.

One embodiment of a light emitting diode (LED) package comprising an LED chip comprising an LED flip chip mounted on a submount, the submount comprising surface mount leads and conductive vias through the submount, the LED chip further comprising a substantially continuous and unobstructed phosphor loaded binder coating on at least the top surface of the LED. The phosphor within the coating absorbs and converts the wavelength of at least some of the LED light. The coating is planarized to achieve the desired emission color of the LED chip. A second submount having a plurality of package leads with the LED chip mounted to the second submount and in electrical contact with at least one of the package leads.

These and other aspects and advantages of the invention will become apparent from the following detailed description and the accompanying drawings which illustrate by way of example the features of the invention.

BRIEF DESCRIPTION OF THE DRAWINGS

FIG. 1e is a sectional view of the submount wafer and LED wafer in FIG. 1d following singulating;

FIG. 2a is a perspective view of one embodiment of and LED package according to the present invention;

FIG. 2b is a top view of the LED package shown in FIG. 2a;

DETAILED DESCRIPTION OF THE INVENTION

Figure 1A:
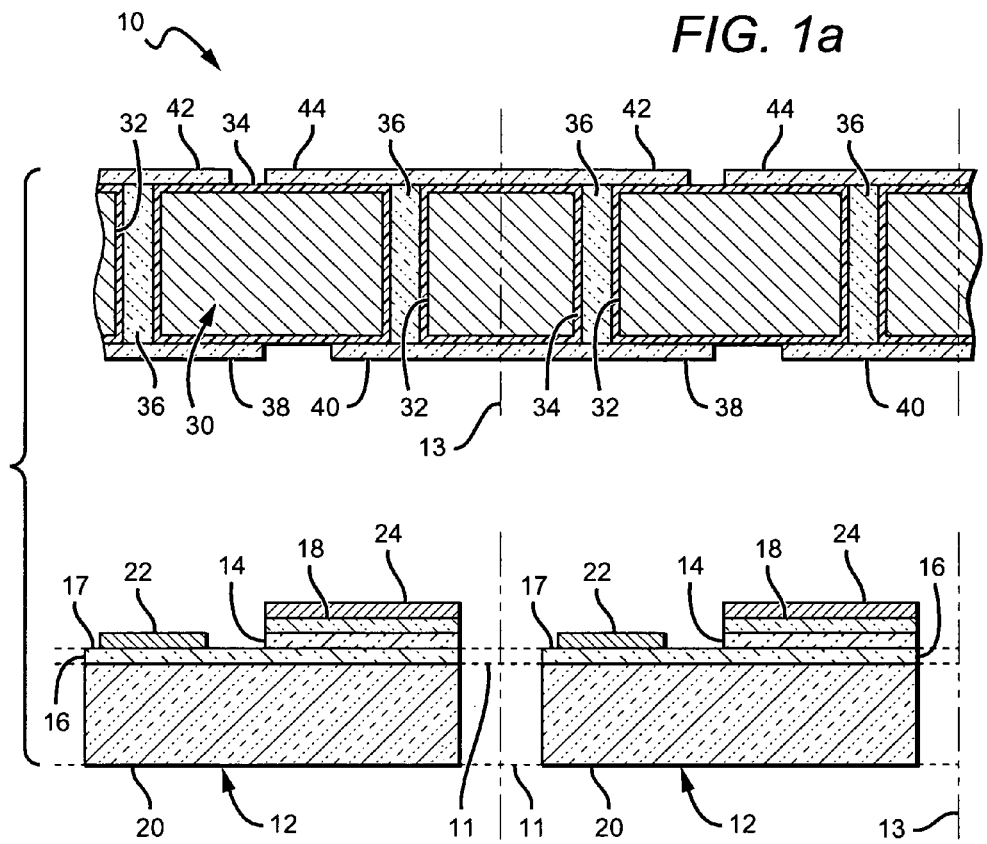
FIG. 1a is a sectional view of one embodiment of a submount wafer and LED wafer at a fabrication step in one method according to the present invention.

The present invention provides fabrication methods that are particularly applicable to wafer level coating of semiconductor devices such as LEDs. The present invention also provides semiconductor devices, such as LEDs fabricated using these methods, and related LED packages and LED arrays. In particular the present invention provides for methods of making devices and devices that can be surface mounted and are wire-bond free. A curable blanket coating is provided over the devices that can then be thinned or planarized without the need for gaining electrical access to contacts through the cured material following planarization. Instead, electrical contact is made to the device from the surface opposite the blanket coating. The resulting coating on the top of the devices is continuous and unobstructed by structures such as contacts, bond pads, conductive paths, etc. The coating provides a surface that is particularly adapted for the direct mounting of additional structures, such as secondary optics.

In one embodiment, the devices comprise lateral geometry LEDs that are flip-chip mounted to a submount, with both the LEDs and the submount being at the wafer level. The submount comprises conductive vias aligned with and in electrical contact with the LED contacts, allowing the LED to be electrically contacted through the submount without the need for wire bonds. A curable blanket coating having a conversion material is included over the LEDs, opposite the submount, without needing access to the LED contacts through the blanket coating. The coating can then be thinned as desired to obtain the desired thickness of the overall device or to obtain the desired color point.

The present invention eliminates complex wafer alignment fabrication processes and eliminates the need to access wire bond pads after blanket coating. It also eliminates the reliability problems associated with coating devices after wire bonding and the danger of damaging the wire bonds. Instead a simple and cost effective approach is utilized. It allows for wafer level coating of semiconductor devices without the need for alignment. A wide variety of coating technologies can be used such as spin-coating of phosphor loaded silicone mixture, or electrophoretic deposition of phosphor followed by blanket coating of silicone or other binding material. Mechanical planarization allows thickness uniformity over the wafer and thickness uniformity of the coating can be achieved over a wide thickness range (e.g. 1 to 100 µm). White LED chip color point may be fine tuned by controlling the final coat thickness, including using an iterative approach (e.g. grind, test, grind, etc.) which will result in tightly binned white LEDs. This approach is also scalable to large wafer sizes.

The present invention is described herein with reference to certain embodiments but it is understood that the invention can be embodied in many different forms and should not be construed as limited to the embodiments set forth herein. In particular, the present invention is described below in regards to coating LEDs with a down-converter coating that typically comprises a phosphor loaded binder ("phosphor/binder coating"), but it is understood that the present invention can be used to coat LEDs with other materials for down-conversion, protection, light extraction or scattering. It is also understood that the phosphor binder can have scattering or light extraction particles or materials, and that the coating can be electrically active. The methods according to the present invention can also be used for coating other semiconductor devices with different materials. Additionally, single or multiple coatings and/or layers can be formed on the LEDs. A coating can include no phosphors, one or more phosphors, scattering particles and/or other materials. A coating may also comprise a material such as an organic dye that provides down-conversion. With multiple coatings and/or layers, each one can include different phosphors, different scattering particles, different optical properties, such as transparency, index of refraction, and/or different physical properties, as compared to other layers and/or coatings.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention. For purposes of illustration and understanding, some of the features of the embodiments below may be shown out of scale in the following figures.

FIGS. 1a through 1e show one embodiment of wafer level LED chips 10 manufactured using a method according to the present invention with the series of figures showing the LED chips at fabrication steps. That is, the LEDs chips 10 are shown in some figures at a point where all the fabrication steps have not been completed before being separated/singulated into individual LED chips. The LED chips 10 comprise LEDs 12 and for ease of description and understanding the LEDs 12 are shown as separate devices. It is understood, however, that one or more of the LED layers can be continuous so that the LEDs 12 can be provided in wafer form. In the embodiment shown, horizontal phantom lines 11 illustrate alternative embodiments where certain layers are continuous. Vertical phantom lines 13 are included to show separation or dicing line between the LED chips 10 at a later fabrication step. As further described below, this separation or dicing can take place at different points in the fabrication process.

FIGS. 1a through 1e also show only two devices at the wafer level, but it is understood that many more LED chips can be formed from a single wafer. For example, when fabricating LED chips having a 1 millimeter (mm) square size, up to 4500 LED-chips can be fabricated on a 3 inch wafer.

Each of the LEDs 12 can have many different semiconductor layers arranged in different ways. The fabrication and operation of LEDs is generally known in the art and only briefly discussed herein. The layers of the LEDs 12 can be fabricated using known processes with a suitable process being fabrication using metal organic chemical vapor deposition (MOCVD). The layers of the LEDs 12 generally comprise an active layer/region 14 sandwiched between first and second oppositely doped epitaxial layers 16, 18, all of which are formed successively on a substrate 20.

It is understood that additional layers and elements can also be included in the LED 12, including but not limited to buffer, nucleation, contact and current spreading layers as well as light extraction layers and elements. The active region 14 can comprise single quantum well (SQW), multiple quantum well (MQW), double heterostructure or super lattice structures. In one embodiment, the first epitaxial layer 16 is an n-type doped layer and the second epitaxial layer 18 is a p-type doped layer, although in other embodiments the first layer 16 can be p-type doped and the second layer 18 n-type doped. The first and second epitaxial layers 16, 18 are hereinafter referred to as n-type and p-type layers, respectively.

The region 14 and layers 16, 18 of the LEDs 12 may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the n- and p-type layers 16, 18 are gallium nitride (GaN) and the active region 14 is InGaN. In alternative embodiments the n- and p-type layers 16, 18 may be AlGaN, aluminum gallium arsenide (AlGaAs) or aluminum gallium indium arsenide phosphide (AlGaInAsP).

The substrate 20 can be made of many materials such at sapphire, silicon carbide, aluminum nitride (AlN), GaN, Si, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022. In the embodiment shown, the substrate 20 is at the wafer level, with the plurality of LEDs 12 formed on the wafer substrate 20.

The substrate 20 can have different thicknesses with one embodiment of the LED chips 10 having a substrate that can be up 600 μm thick or more. In an optional processing step, the substrate 20 can also be thinned using known methods such as mechanical grinding, etching, laser-ablation, to allow for easier and more reliable singulating of the LED chips. This thinning can also result in LED chips having the desired thickness. In one embodiment, the substrate 20 can be thinned to have a thickness of approximately 100 μm and the LEDs 12 can have an overall thickness of approximately 3 μm. The LED chips with the additional layers and coatings as described below can have an overall thickness of 100 to 200 μm. In still other embodiments where the substrate 20 is made of a material, such as sapphire, that is compatible with shaping, the substrate 20 can include different shapes to enhance light extraction.

The present invention is particularly adapted for use with LEDs arranged so that both contacts are accessible from one surface, such as with lateral geometry LEDs as shown where both contacts are on the top of the LEDs. Lateral geometry devices are usually arranged with a split-level electrode configuration with both electrodes on the top surface of layers on different levels of the device. Thus, the electrodes do not share a common surface but rather a common top-side orientation with respect to the layers on which they are disposed. Charge carriers move laterally through the semiconductor layers for at least a portion of the current path in response to a bias. Several variations of this common geometry are known and used in the art.

In the embodiment shown, a portion of the p-type layer 18 and active region is removed, such as by etching to expose a contact mesa 17 on the n-type layer 16. Each of the LEDs 12 can have first and second electrodes or contacts 22, 24. In the embodiment shown, the first contact 22 is on mesa of the n-type layer 16 and the second contact 24 on the p-type layer 18. An electrical signal applied to the first contact 22 spreads into the n-type layer 16 and a signal applied to the second contact 24 spreads into the p-type layer 18. The first and second contacts can comprise many different materials such as Au, copper (Cu) nickel (Ni), indium (In), aluminum (Al), silver (Ag), or combinations thereof. In still other embodiments can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired electrical characteristics such as transparency, junction resistivity and sheet resistance.

It is understood that other LED structures and geometries can be provided for use in the present invention with the structures having contacts accessible from one surface. These alternative embodiments can provide this access by utilizing other conductive structures such as conductive vias, traces or other conductive paths.

In the embodiment shown, the second contact 24 covers substantially all of the p-type layer 18 and the first contact covers substantially the entire n-type layer mesa, and because light is emitted from the LED primarily through the substrate 20, the first and second contacts 22, 24 do not interfere with or reduce light emission. In other embodiments, the first and second contacts 22, 24 can cover less than of their respective surfaces and other layers or structures can be included to assist in current spreading across the their surfaces. In one embodiment, a thin current spreading layer can cover some or all of the p-type layer 18 and n-type surface, which can be transparent or semitransparent. Examples of these materials include platinum (Pt) or a transparent conductive oxides such as indium tin oxide (ITO), although other materials can also be used. The first and second contacts 22, 24 can have different thicknesses, such as approximately 3 μm.

Current spreading structures (not shown) can also be included on the surfaces of the p-type or n-type mesa to improve current spreading and injection from their contacts. The current spreading structures can have many different forms, but preferably comprises fingers of conductive material on the surface of the LED contacting the one of the contacts 22, 24. The current spreading structures can be deposited using known methods and can comprise the materials described above such as Au, Cu, Ni, In, Al, Ag or combinations thereof and conducting oxides and transparent conducting oxides.

When fabrication of the LED chips 10 is complete, each will comprise portions of submount or carrier wafer 30 with the LEDs 12 flip-chip mounted to it. The submount wafer 30 is shown separate from the LEDs 12 and like the LEDs 12 above, the submount wafer 30 is shown at a wafer level of the fabrication process. Phantom lines 13 are similarly included to show separation or dicing line between at the submount wafer 30 for the individual LED chips 10. When fabrication is complete each of the LED chips will have a portion of the submount wafer as approximately defined by the phantom lines 13. For example, the submount wafer 30 can be sized for fabricating LED chips having a 1 millimeter (mm) square size, and can provide submount portions for up to 4500 LED chips.

The submount wafer 30 can be made of many different materials, such as conducting or semiconducting materials or insulating materials. Some suitable materials include ceramics such as alumina, aluminum oxide, aluminum nitride or polymide. In other embodiments the submount wafer can comprise a printed circuit board (PCB), saffire or silicon, silicon carbide, or any other suitable material, such as commercially available T-Clad thermal clad insulated substrate material.

The submount wafer 30 comprises a plurality of through-holes 32 that can be formed using known processes such as etching, with two or more of the through holes 32 arranged to cooperate with a respective one of the LEDs 10. In the embodiment shown, the through-holes 32 are arranged in sets of two, with each of the sets sized and spaced to align with the n and p-type contacts 22, 24 of a respective one of the LEDs 12.

A dielectric layer 34 is included covering the surface of the submount wafer 30, including the surfaces of the through-holes 32. The dielectric layer 34 electrically insulates the wafer such that electrical signals on the surfaces of the submount wafer 30 do not spread into the submount wafer 30. This prevents the signals being applied n- and p-type contacts 22, 24 from shorting through the submount wafer 30, and in particular from preventing shorting of the signals being applied through the through-holes 32. Different materials can be used for the dielectric layer, with suitable materials being silicon nitride or silicon oxide.

For submount wafers made of an insulating material such as ceramic, it may not be necessary to include the dielectric layer 34 for electrical isolation. The dielectric layer, however, may still be included to act as an adaptive layer between the submount wafer surfaces and subsequent materials deposited on it, such as metals, to promote adhesion of these materials to the submount surfaces.

Each of the through-holes 32 can be filled with a conductive material to form conductive vias 36 through the submount 30. An electrical signal applied to the vias at one opening at the top or bottom of the submount wafer 30 conducts through the vias 36, through the submount wafer 30, to the opposite opening. Each of the LED chips can have first and second bottom metal pads or traces 38, 40 on the bottom surface of its portion of the submount wafer 30 that are arranged so that after dicing of the LED chips, they are electrically and physically separated by a space on the bottom surface. Each of the bottom traces 38, 40 is electrically coupled to a respective one of the vias 36. An electrical signal applied to the first bottom metal trace 38 is conducted to one of the LED chip's vias 36, with a signal applied to the second bottom metal trace 40 is conducted to the other of the LED chip's vias. In the embodiments shown, the bottom traces 38, 40 are particularly adapted to allow for surface mounting of the LED chips using known surface mount methods. It is understood, however, that the present invention is applicable to LED chips arranged to be mounted using other methods beyond surface mounting.

First and second top traces 42, 44 can be included on the top surface of the submount 30 and also physically and electrically separated by a space following singulating, with each electrically coupled to one of the vias 36 for its particular LED chip 10. In the embodiment shown, the first top trace 42 is arranged to conduct a signal from one of the vias 36 to the n-type contact 22 and the second top trace 44 is arranged to conduct a signal from the other of the vias 36 to p-type contact 24.

The vias 36 and traces 38, 40, 42, 44 can be formed of many different electrically conductive materials and can be formed of the same or different materials. They can be formed using many different known physical or chemical deposition processes such as electroplating, mask deposition (e-beam, sputtering), electroless plating. A suitable material is Au, but other materials can be used including Cu, Ni, In, combinations thereof, or the conducting oxides and transparent conducting oxides listed above. The space between the traces can be formed using known processes such as etching.

Figure 1B:
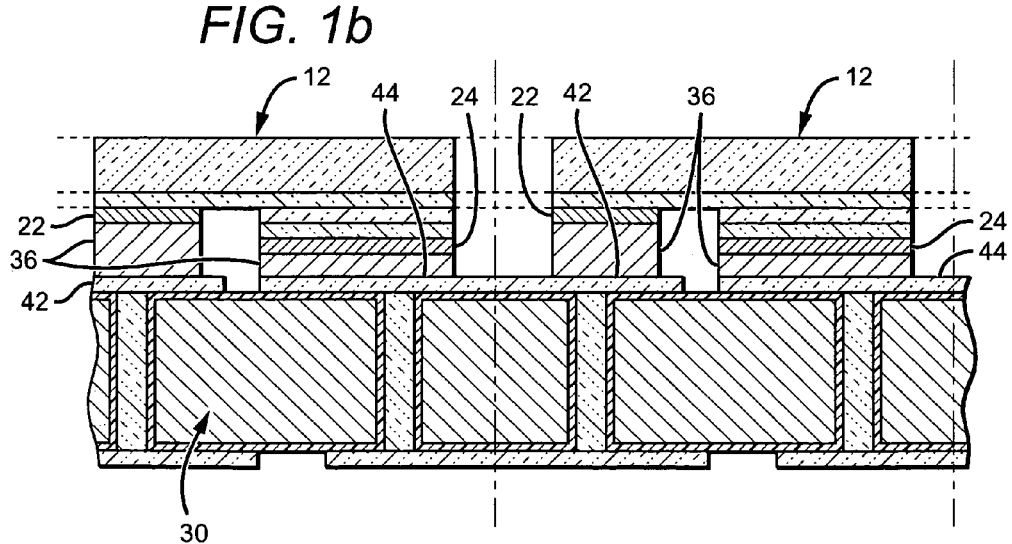
FIG. 1b is a sectional view of the submount wafer and LED wafer in FIG. 1a following flip-chip mounting.

Referring now to FIG. 1*b*, the LEDs 12 in wafer form are flip-chip mounted to the submount wafer 30, and electrical connection is made between the respective sets of top traces 42, 44 and the first and second contacts 22, 24 for a respective one of the LEDs 12. Flip-chip mounting is generally known in the art and only briefly discussed herein. The LEDs 12 are mounted to the submount wafer 30 by layer of conductive bond material 36, which is typically one or more bond/metal layers such as solder. The bond material 36 is generally between the top traces 42, 44 and the first and second contact 22, 24, and can also be made of a material that reflect light. As more fully described below, this reflective property can improve the LED chip's emission efficiency.

The bond material 36 leaves the space between the first and second top traces uncovered to prevent shorting between the two. It is understood that in other embodiments separated/singulated LEDs can be individually flip-chip mounted to the submount wafer 30. Flip-chip methods and approaches are described in John Lau, "Flip-Chip Technologies", McGraw Hill, 1996.

This flip chip arrangement leaves a flat top surface, which in this embodiment is the substrate, without being obstructed wire bonds, contacts, or other structures for making electrical contact to the LED. This provides a particularly well-situated surface for accepting a continuous blanket phosphor coating. For those embodiments having and LED wafer with a continuous substrate and n-type layer, an embodiment of a method according to the present invention can comprise the optional step of now separating the LEDs in the wafer by removing the portions of the substrate and n-type layer between adjacent LEDs. This can be accomplished using known methods such as etching.

In other embodiments, the LEDs 12 can be provided with roughened layers to enhance light extraction. The roughening of the LED can result in features having different depths in the LEDs 12, with the roughening providing valleys having a depth of up to 2 µm. Although the depth of the textured features can vary, the preferred depth is greater than 10% of the overall thickness of the LEDs.

Figure 1C:
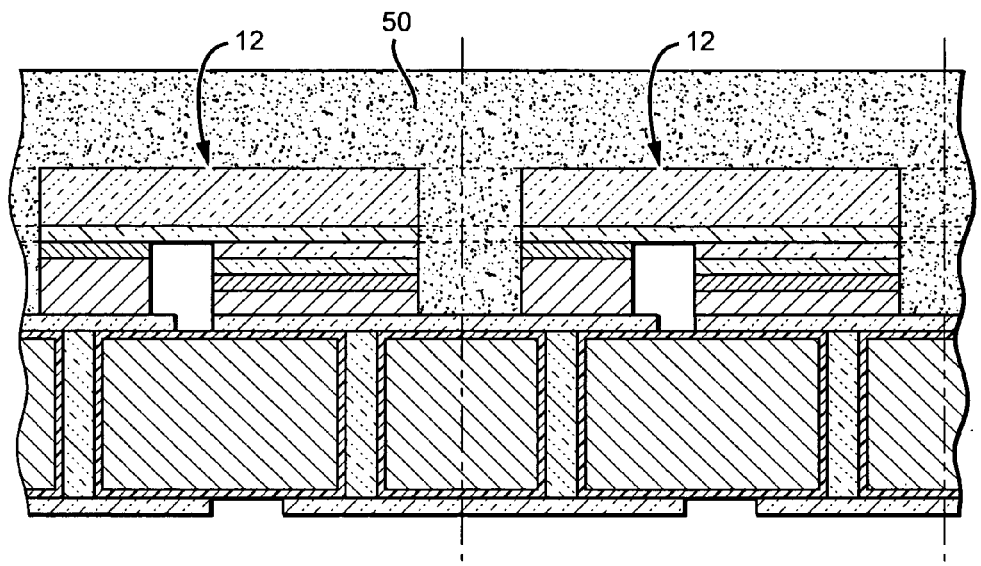
FIG. 1c is a sectional view of the submount wafer and LED wafer in FIG. 1b following coating of the LEDs.

Referring now to FIG. 1*c*, the wafer is blanketed by a phosphor/binder coating 50 that covers each of the LED 12 and associated open spaces. The present invention provides the advantage of depositing the phosphor coating over the LEDs 12 at the wafer level without the need for alignment over particular devices or features. Instead, the entire wafer is covered, which provides for a simpler and more cost effective fabrication process.

In the embodiments where the LED layers are provided as continuous across the LED wafer, and not separated into individual devices prior to coating, the phosphor/binder coating covers only the top surface of LEDs. When the LEDs are singulated their side surfaces are typically not covered by the phosphor/binder coating, and the devices can experience emission of unconverted light through these surfaces. This can be acceptable in some applications, but to produce a more uniform emission at different viewing angles, the devices can be diced or singulated prior to mounting on the submount wafer 30, or can be fully or partially diced following wafer mounting of the LED chip wafer on the submount wafer 30. The dicing can reach different depths, and in different embodiments the partial dicing can pass only partially through the LED layers, or can pass into the submount wafer 30. The depth of the dicing corresponds to the depth to which the side surface will be covered by the phosphor/binder coating following coating and dicing. For example, if the partial dicing passes through the LED layers and partially into the submount wafer 30, a portion of the side surface of the submount wafer 30 will be covered by the phosphor/binder following dicing, with the portion of the coating corresponding to the dicing depth.

In other embodiments where the coating is only on the top surface following dicing, the devices can be coated a second time to provide coverage on the side surfaces. This, however, introduces a second coating step which can add complexity and cost to the fabrication process.

The phosphor/binder coating can be applied using different processes such as spin coating, spray coating, dispensing, electrophoretic deposition, electrostatic deposition, printing, jet printing or screen printing. In other embodiments the coating 50 can be provided as a separately fabricated preform that can be bonded over each of the LEDs. Processes such as spin coating or spray coating typically utilize a binder material during the phosphor deposition, while other processes require the addition of a binder immediately following their deposition to stabilize the phosphor particles/powder.

In a preferred embodiment, the phosphor coating 50 can be deposited over the wafer in a phosphor/binder mixture using spin coating. Spin coating is generally known in the art and generally comprises depositing the desired amount of binder and phosphor mixture at the center of the substrate and spinning the substrate at high speed. The centrifugal acceleration causes the mixture to spread to and eventually off the edge of the substrate. Final layer thickness and other properties depend on the nature of the mixture (viscosity, drying rate, percent phosphor, surface tension, etc.) and the parameters chosen for the spin process. For large wafers it may be useful to dispense the phosphor/binder mixture over the substrate before spinning the substrate at high speed.

In another embodiment, the phosphor coating 50 is deposited on the wafer using known electrophoretic deposition methods. The wafer and its LEDs are exposed to a solution containing phosphor particles suspended in a liquid. An electrical signal is applied between the solution and the LEDs which creates an electrical field that causes the phosphor particles to migrate to and deposit on the LEDs. The process typically leaves the phosphor blanketed over the LEDs in powder form. A binder can then be deposited over the phosphor with the phosphor particles sinking into the binder to form the coating 32. The binder coating can be applied using many known methods and in one embodiment, the binder coating can be applied using spin coating.

The phosphor/binder coating 50 can then be cured using many different curing methods depending on different factors such as the type of binder used. Different curing methods include but are not limited to heat, ultraviolet (UV), infrared (IR) or air curing.

Different factors determine the amount of LED light that will be absorbed by the phosphor/binder coating in the final LED chips, including but not limited to the size of the phosphor particles, the percentage of phosphor loading, the type of binder material, the efficiency of the match between the type of phosphor and wavelength of emitted light, and the thickness of the phosphor/binding layer. These different factors can be controlled to control the emission wavelength of the LED chips according to the present invention.

Different materials can be used for the binder, with materials preferably being robust after curing and substantially transparent in the visible wavelength spectrum. Suitable material include silicones, epoxies, glass, inorganic glass, spin-on glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. In other embodiments, the binder material can be engineered to be index matched with the features such as the chip (semiconductor material) and growth substrate, which can reduce total internal reflection (TIR) and improve light extraction.

Many different phosphors can be used in the coating 50 according to the present invention. The present invention is particularly adapted to LED chips emitting white light. In one embodiment according to the present invention LEDs 12 emit light in the blue wavelength spectrum and the phosphor absorbs some of the blue light and re-emits yellow. The LED chips 10 emit a white light combination of blue and yellow light. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:
$Tb_{3-x}RE_xO_{12}$:Ce (TAG); RE=Y, Gd, La, Lu; or
$Sr_{2-x-y}Ba_xCa_ySiO_4$:Eu.

First and second phosphors can also be combined for higher CRI white of different white hue (warm white) with the yellow phosphors above combined with red phosphors. Different red phosphors can be used including:
$Sr_xCa_{1-x}S$:Eu, Y; Y=halide;
$CaSiAlN_3$:Eu; or
$Sr_{2-y}Ca_ySiO_4$:Eu Other phosphors can be used to create saturated color emission by converting substantially all light to a particular color. For example, the following phosphors can be used to generate green saturated light:
$SrGa_2S_4$:Eu;
$Sr_{2-y}Ba_ySiO_4$:Eu; or
$SrSi_2O_2N_2$:Eu.

The following lists some additional suitable phosphors used as conversion particles in an LED chips 10, although others can be used. Each exhibits excitation in the blue and/or UV emission spectrum, provides a desirable peak emission, has efficient light conversion, and has acceptable Stokes shift:
Yellow/Green
$(Sr,Ca,Ba)(Al,Ga)_2S_4$:$Eu^{2+}$
$Ba_2(Mg,Zn)Si_2O_7$:$Eu^{2+}$
$Gd_{0.46}Sr_{0.31}Al_{1.23}O_xF_{1.38}$:$Eu^{2+}_{0.06}$
$(Ba_{1-x-y}Sr_xCa_y)SiO_4$:Eu
$Ba_2SiO_4$:$Eu^{2+}$
Red
$Lu_2O_3$:$Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:$Pr^{3+}$, $Ga^{3+}$
$CaAlSiN_3$:$Eu^{2+}$
$Sr_2Si_5N_8$:$Eu^{2+}$ Different sized phosphor particles can be used including but not limited to 10-100 nanometer (nm)-sized particles to 20-30 μm sized particles, or larger. Smaller particle sizes typically scatter and mix colors better than larger sized particles to provide a more uniform light. Larger particles are typically more efficient at converting light compared to smaller particles, but emit a less uniform light. In one embodiment, the particle sizes are in the range of 2-5 μm. In other embodiments, the coating 50 can comprise different types of phosphors or can comprise multiple phosphor coatings for monochromatic or polychromatic light sources.

The methods according to the present invention can be more effective at depositing different sized particles on an LED compared to conventional deposition processes such as EPD. In EPD deposition processes similarly sized phosphor particles may respond to the electric field in the solution and deposit on the LED. Particles having different sizes, and in particular larger sizes, may not react to the electric field in the same way and may not deposit. Utilizing the present method, different sized phosphors can be included in the coating as desired before it is applied such that the end coating can have the desired combination of smaller sizes to effectively scatter and mix the light, and larger sizes to efficiently convert the light.

The coating 50 can have many different thicknesses over the LEDs 12, such as in the range of 1 to 100 μm, and in one embodiment a suitable range of thicknesses is 30 to 50 μm. The coating 50 can also have different concentrations or loading of phosphor materials in the binder, with a typical concentration being in range of 30-70% by weight. In one embodiment, the phosphor concentration is approximately 65% by weight, and is preferably uniformly dispersed throughout the binder. Still in other embodiments the coating can comprise multiple layers of different concentrations or types of phosphors, and the multiple layers can comprise different binder materials. In other embodiments one or more of the layers can be provided without phosphors with one or more being substantially transparent to the LED light. As more fully described below, in some embodiments a first coat of clear silicone can be deposited followed by phosphor loaded layers.

Figure 1D:
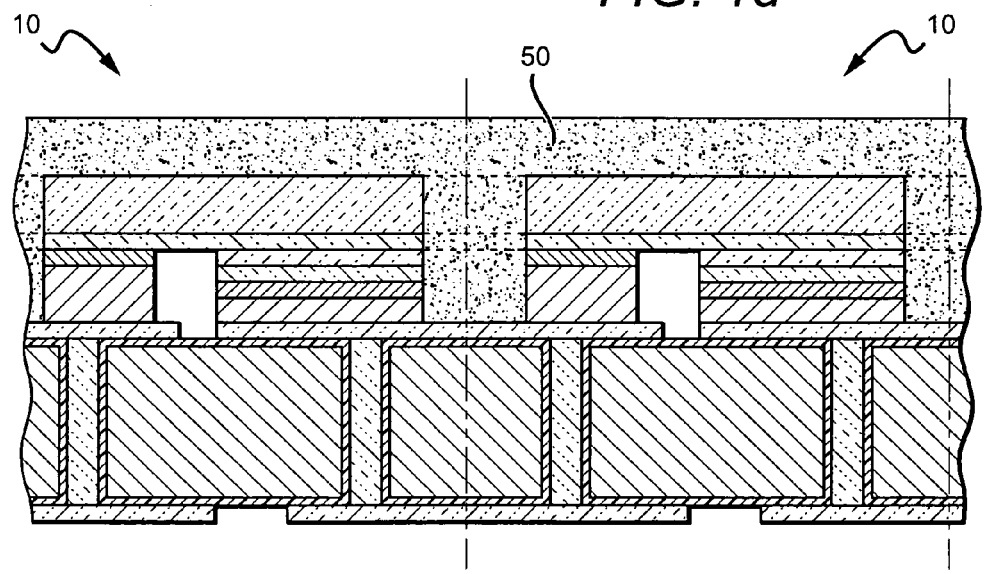
FIG. 1d is a sectional view of the submount wafer and LED wafer in FIG. 1c following planarization of the coating.

Referring now the FIG. 1d, the coating 50 can be thinned or planarized to control the thickness of the layer and also to control the emission color-point of the LED chip 10. Many different thinning processes can be used including known mechanical processes such as grinding, lapping or polishing, preferably after the binder has cured. Other fabrication methods can comprise a squeegee to thin the coating before cured or pressure planarization can also be used before the coating is cured. Still in other embodiments the coating can be thinned using physical or chemical etching, or ablation. In one embodiment, the coating has substantially the same thickness across the top surfaces of the LEDs, but in other embodiments the thicknesses can be different over different LEDs.

The coating 50 can have many different thicknesses following planarization, with a range of thicknesses in one embodiment being 1 to 100 μm. In still another embodiment, the suitable range of thicknesses is 30 to 50 μm. In other embodiments, the thickness of the coating can be non-uniform across the wafer or across a single LED, such as to compensate for LED emission variations in intensity and spectrum across the wafer.

Following planarization, the surface root mean squared roughness of the coating should be approximately 10 nm or less, although the surface can have other surface roughness measurements. In some embodiments the surface can be textured during planarization. In other embodiments, after planarization the coating or other surfaces, can be textured such as by laser texturing, mechanical shaping, etching (chemical or plasma), scratching or other processes, to enhance light extraction. Texturing results in surface features that are 0.1-5 µm tall or deep, and preferably 0.2-1 µm. In other embodiments, the surface of the LEDs 12 can also be shaped for improved light extraction.

Referring now to FIG. 1e, the individual LED chips 10 can be singulated from the wafer using known methods such as dicing, scribe, breaking, cleaving or etching. This generally comprises cutting through the coating 50 and the submount wafer 30 between LEDs 12 either from the bottom through the submount wafer first or the top through the coating 50 first. The singulated LED chips 10 can have a portion of the coating 50 remaining on at lease part of the sidewalls of the LEDs 12. The singulating process separates each of the LED chips 10 with each having substantially the same thickness of coating 50, and as a result, substantially the same amount of phosphor and emission characteristics. This allows for reliable and consistent fabrication of LED chips 10 having similar emission characteristics. As more fully described below, this sidewall coating can enhance the uniform emission of the LED chips, by converting at least some of the light emitting through the side surfaces of the LEDs 12.

Following singulating the LED chips can be mounted in a package, or to a submount or printed circuit board (PCB) without the need for further processing to add phosphor. A conventional encapsulation can then surround the LED chip. In another embodiment, the LED chip can be enclosed by a hermetically sealed cover with an inert atmosphere surrounding the LED chip at or below atmospheric pressure.

The LED chip 10 can be surface mounted in a package without the use of wire bonds to apply an electrical signal. In particular, there is no wire bond to the top surface of LED chip 10 for applying an electrical signal, which leaves an unobstructed top surface. Accordingly, a package utilizing the LED chip 10 can have secondary optics directly mounted on the top surface of the binder without the need for compensating for wire bonds or other structures. This can simplify fabrication of the LED package by not having an intermediate layer between to cover the wire bonds before mounting the secondary optics or by not having other features such as reflective cups that allow for the secondary optics to be mounted above the LED chip with a space for the wire bonds.

The flip-wafer bonded LEDs can also have reflective elements or layers to encourage light emission in the desired direction. A reflective layer (not shown) can be included between the LEDs 12 and the submount 30 and can comprise a highly reflective metal or reflective semiconductor structures such as a DBR. The reflective layer reflects LED light that is emitted toward the submount 30 and helps prevent light from passing into the submount where at least some of the light can be absorbed by the substrate. This also encourages light emission toward the top of the LED chips. As mentioned above the bond/metal layer 36 can also have reflective properties to reflect light from the LED chip. Reflective layers can also be included in other locations on the LED chips and that the first and second contacts, and top and bottom traces can also serve as reflectors.

Figure 2C:
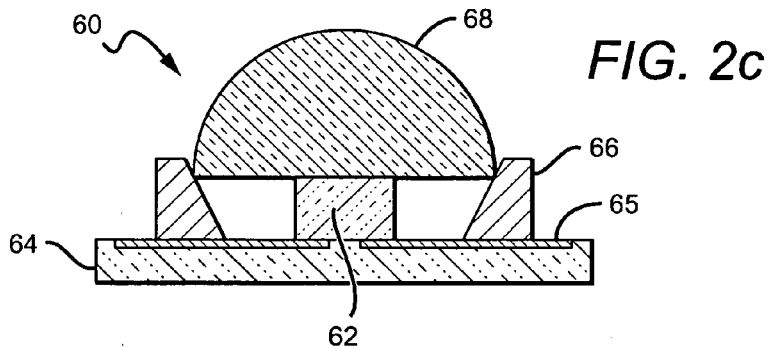
FIG. 2c is a sectional view of the LED package shown in FIG. 2b, taken along section lines 2c-2c.

The LED chips described above can be mounted in different LED packages according to the present invention. FIGS. 2a through 2c show one embodiment of an LED package 60 utilizing one or more LED chips 62 according to the present invention. The package 60 generally comprises a second submount or PCB 64 with package leads 65, with the LED chip 62 mounted on the PCB 64 and electrically connected to the package leads 65. In some embodiments a reflector cup assembly ("reflector cup") 66 can also be mounted on the PCB 64. Secondary optics, such as a lens 68 can be placed over the LED 62 and in the embodiment shown the lens 68 can be mounted directly on LED 62. Light from the LED 62 passes primarily through the lens 68 with at least some of the light emitted laterally from the LED chip being reflected by the reflector cup 66 to contribute to useful emission from the package 60. Space between the bottom of the lens 68 and the remainder of the package 60 can be filled with an encapsulating material such as a liquid silicone gel (not shown). Many different lenses and encapsulating materials can be used in the packages according to the present invention to provide different output characteristics.

In LED packages utilizing convention coating methods such as the "glob" method or EPD, much of the area within the reflective cup 66 can be covered by a conversion material and its binder, including the LED chip, the surface of the substrate, and the surfaces of the reflective cup. Utilizing LED chips fabricated according to the present invention, the phosphor/binder coating is confined to the LED chip with the other surfaces remaining uncovered. The LED package 60 can also compensate for emission of unconverted light around the edges of the LED package, by reflecting the unconverted light to mix with the converted light.

It is understood that LED chips according to the present invention can be mounted in many different packages. In one alternative embodiment, the LED chip is mounted on a PCB and the lens is molded over the LED chip. A reflective cup may be included, but some embodiments will be provided without it.

The method above describes fabrication of LED chips and packages by a series of steps, but it is understood that different steps can be included and the steps can occur in different sequences. For example, the LED chips can be flip-chip mounted to a submount wafer and then singulated. One or more of the singulated chips can be mounted to a package and then coated by a conversion material using one of the methods described above. A binder can be included in with the conversion material and following curing of the binder, the layer of conversion material can be thinned as desired. Secondary optics can be included on the layer of thinned conversion material without the need to accommodate a wire bond or other structure.

It is understood that in other embodiments, the LED chip's growth substrate can be removed after (or before) flip-wafer bonding, with the substrate removed using known grinding and/or etching processes. In other embodiments, the growth substrate or at least portions thereof remain. The growth substrate or the remaining portions can be shaped or textured to enhance light extraction from the LEDs.

In other embodiments of LED chips according to the present invention, the coating can have different geometries and can cover less than all of the LED or can cover most of the surfaces of the LED chip. The top surface of the LED or the phosphor coating can also be textured as described above.

The embodiments of the coatings described above are shown with phosphors that are substantially uniform throughout. Different embodiments of LED chips according to the present invention can also have coating with sections having different concentrations and types of phosphors. The coating can also be tailored such that it can have different thicknesses at different locations on the LED chip.

In other embodiments of LED chips fabricated according to the present invention the phosphor coating can be provided as a prefabricated or preformed coating layer that can have the phosphor (and other) materials described above fixed in a binder also made of the materials described above. The preformed layer can be placed over and covering the LEDs and in one embodiment, a bonding material can be included between the layer and the LED chips for adhesion. Suitable adhesives can be silicones or epoxies. To further encourage conformal coating, the perform layer can be heated or a vacuum can be applied to pull the layer down over the LED chips. The preform layer can also be provided in a state where the binder is not fully cured so that the layer more readily conforms to the LED chips. Following conformal placement of the preform layer, the binder can be exposed to its final curing. The preform layer can be planarized using the methods described above and the LED chips 100 can then be singulated using the methods described above. This method allows for the use of different layer thicknesses and composition for different desired emission characteristics for the LED chips. It is understood that in different embodiments more than one prefabricated or preformed layers can be utilized having different phosphors in different concentration and in different binder materials to achieve the desired LED chip emission color point.

Figure 3A:
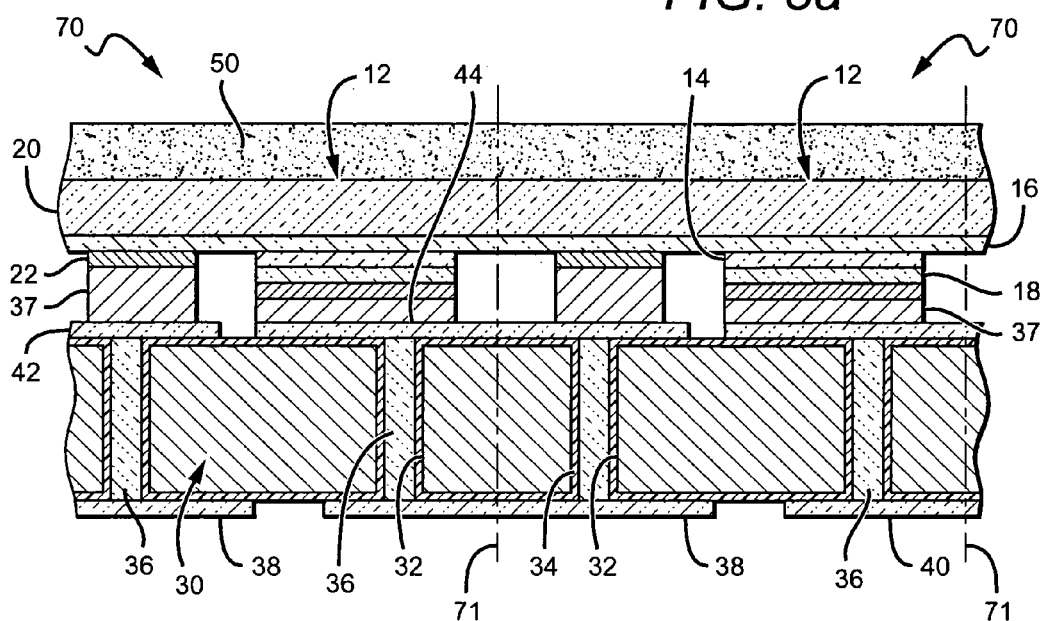
FIG. 3a is a sectional view of another embodiment of a submount wafer and LED wafer at a fabrication step in one method according to the present invention.
Figure 3B:
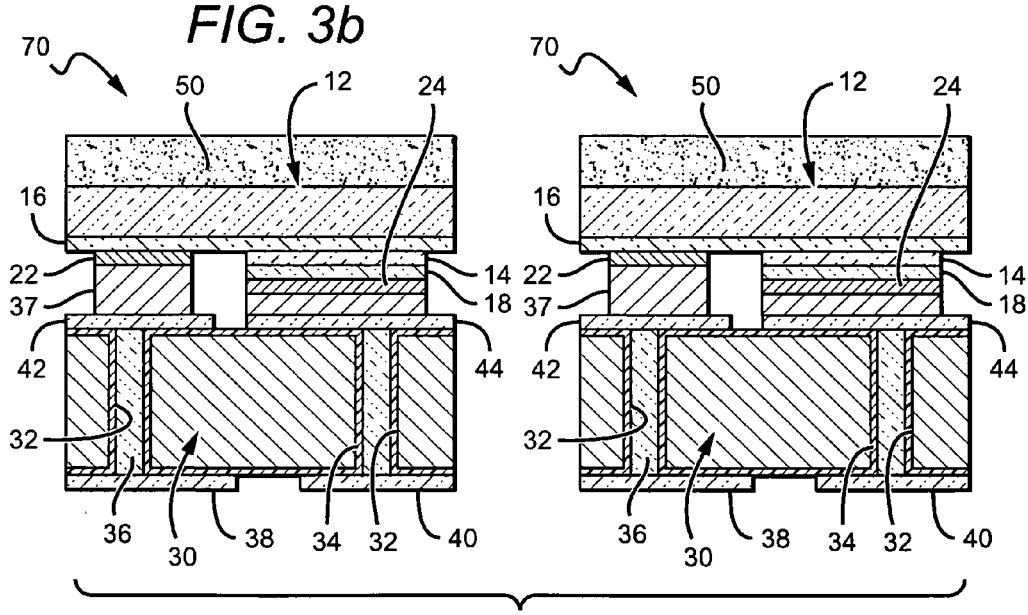
FIG. 3b is a sectional view of the submount wafer and LED wafer in FIG. 3a following singulating.

FIGS. 3a and 3b show another embodiment of LED chips 60 according to the present invention and method for fabricating LED chips 70. For similar features as those in LED chips 10 shown in FIGS. 1a through 1e, the same reference numbers will be used herein with the understanding that the description for these features above applies to the other embodiments using the same reference numbers.

Figure 4A:
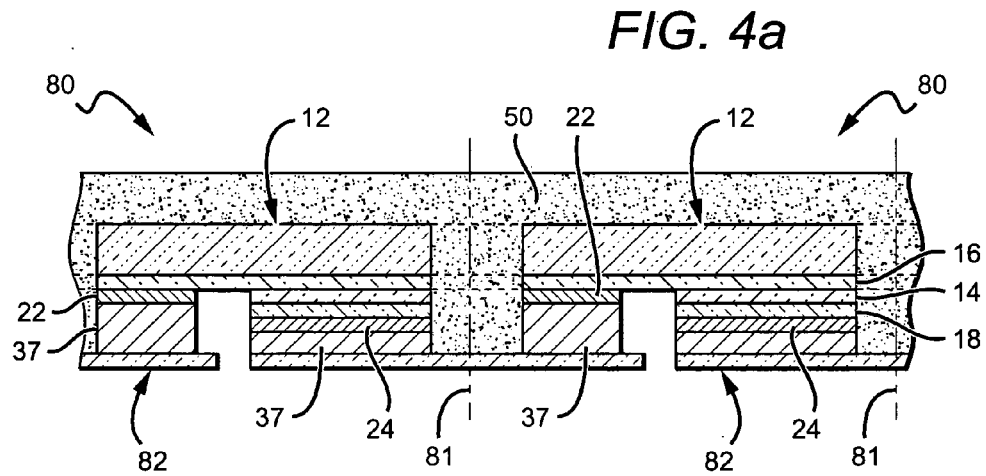
FIG. 4a is a sectional view of another embodiment of a submount wafer and LED wafer at a fabrication step in one method according to the present invention.

Referring to FIG. 4a, LED chips 80 are shown at a wafer level after flip chip mounting of the LEDs to the submount. This is an intermediate fabrication step and the LEDs chips 80 have not been through all the steps necessary before being separated/singulated from wafer into individual LED chips. Phantom lines 81 between the LED chips to show the separation or dicing line between the LED chips 80. Like the LED chips 10 described above and shown in FIGS. 1a through 1e, two devices are shown at the wafer level but it is understood that many more LED chips can be formed from a single wafer.

Each of the LED chips 80 comprise an LED 12 having an active layer/region 14 and oppositely doped n- and p-type layers 16, 18, all of which are on a substrate 20. The LEDs 12 are not separate, but are a single wafer with a continuous substrate 20 and n-type layer 16. Portions of the p-type layer 18 and active region 14 are removed for each of the LED chips to provide an n-type layer mesa for the first contact 22 to be deposited on the n-type layer 16. It is further understood that additional layers can be included in the LED chips 80 as described above. Each of the LEDs 12 can also have a second contact 24 and as described above, that is on the p-type layer. The contacts can comprise the materials described above in FIG. 1a to 1e and can be deposited using known techniques.

LEDs in wafer form are flip-chip mounted to a submount 30 by a bonding material 37. The submount wafer 30 comprises a plurality of through-holes 32 having vias 36, with two or more of the vias 36 arranged to cooperate with a respective one of the LEDs 10. The through-holes 32 are arranged in sets of two that align with the n and p-type contacts 22, 24 of a respective one of the LEDs 12. A dielectric layer 34 is included covering the surface of the submount 30, including the surfaces of the through-holes 32 and each of the through-holes 32 is filled with a conductive material to form conductive vias 36 through the submount 30. The LED chips also have first and second bottom metal pads or traces 38, 40 on the bottom surface of the submount 30 and first and second top traces 42, 44 on the top surface of the submount 30, with each electrically coupled to one of the vias 36.

A phosphor coating 50 is included over the LEDs 12, with the phosphor layer 50 made of the materials described above and including the phosphors and other material, such as scattering particles, as described above. Following curing, the phosphor coating 50 can be thinned or planarized as desired.

Referring now to FIG. 3b, the LED chips 70 are singulated using the methods described above. In this embodiment, however, the singulating process cuts through the coating 50, substrate 20 and n-type layer 16 to singulate the LEDs chips 70 from their wafer. Unlike the embodiment above, following singulating there is no phosphor coating on the side surface of the LEDs 12. This can be acceptable, particularly in embodiments where the LED chip is relatively thin compared to the submount and coating, so that a relatively small amount of unconverted light emits from the side surfaces of the LEDs. This may also be acceptable when a particular hue or color temperature is desired. By not separating the LEDs 12 before coating, the continuous substrate 20 and the n-type layer 16 can provide mechanical support through the coating and planarization fabrication steps.

In other embodiments additional features or materials can be included to provide mechanical support. In one embodiment, a layer of underfill material can be included to fill the open spaces between the LEDs 12 and the submount 30 and the spaces between adjacent LEDs 12, without substantially coating the emitting surfaces of the LEDs 12. The phosphor layer can then be applied to and thinned with the underfill layer providing support. Many different materials can be used for the underfill layer with the preferred material being a curable liquid, such as silicone. Underfill layer can also comprise a phosphor loaded material or binder that can serve to further convert LED light and to reduce optical losses.

Figure 4B:
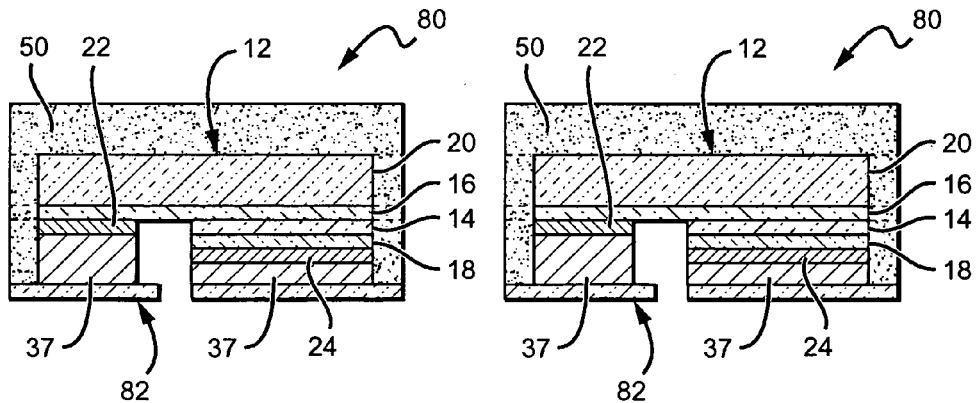
FIG. 4b is a sectional view of the submount wafer and LED wafer in FIG. 4a following singulating.

It is understood that the submount can take many different forms and can have many different features beyond the embodiment described above, and can be made of many different materials. FIGS. 4a and 4b show another embodiment of LED chips 80 according to the present invention also shown at intermediate fabrication steps at the wafer level after flip chip mounting of LEDs 12. Phantom lines 81 between the LED Chips to show the separation or dicing line between the LED chips 80. Like the LED chips 10 described above and shown in FIGS. 1a through 1e, two devices are shown at the wafer level but it is understood that many more LED chips can be formed from a single wafer.

Like the embodiments above, each of the LED chips 80 comprises an LED 12 having an active layer/region 14 sandwiched between oppositely doped n- and p-type layers 16, 18, all of which are on a substrate 20. The LEDs have lateral geometry with the n-type layer 16 and substrate 20 shown as continuous, with phantom separation between respective LEDs. A first contact 22 is on the mesa of the n-type layer 16 and the second contact 24 is on the p-type layer 18.

In this embodiment, however, the submount wafer comprises a metal lead frame 82. The LEDs 12 are flip-chip mounted to a metal lead frame 82 that includes leads for surface mounting the LED chips 80. The lead frame is made of an electrically conductive material, with a suitable material being a metal such as Cu, Au, Al, or nickel (Ni). The lead frame comprises two electrodes per device, one for electrical connection to the first (n-type) contact 22 and the second for electrical connection to the second (p-type) contact 24 by a bond material 37. As shown in FIG. 4b, when the LED chips 80 are singulated each will have its two electrodes for surface mounting, but until the LED chips are singulated the electrodes remain interconnected.

In this embodiment additional mechanical support may be needed following flip-chip mounting for subsequent processing steps such as coating, planarization and singulating. To provide this additional support a layer of underfill material can be included to fill the space between the LEDs 12 and the lead frame 82, without substantially covering the light emitting surfaces of the LEDs 12. Alternatively or to provide additional support, the substrate 20 or the n-type layer or both can be continuous across the wafer with the LEDs separated during singulating.

A phosphor coating 50 is included over the LEDs 12, with the phosphor coating 50 made of the materials described above and can include phosphors and other materials, such as scattering particles, as described above. Following curing, the phosphor coating can be thinned or planarized as desired. For those embodiments not having an underfill material or continuous LED layers for mechanical support, the cured coating can provide mechanical support during planarization and singulating. The LED chips 80 can be singulated using the methods described above with the singulating process also cutting through the lead frames so that each of the LED chips 80 has two leads for surface mounting of the LED chips 80. For the embodiment having a continuous substrate 20 prior to singulating, there is no phosphor coating on the side surface of the LEDs 12.

The LED chips have been described above as being adapted for mounting in packages utilizing a single LED chip. It is understood, however, that the LED chips according to the present invention can be arranged in arrays of LED chips, with the array having LED chips that are structurally the same or similar and emit light at the same or similar wavelengths of light. Alternatively, the LED chips can be structurally different or can emit different wavelengths of light. In some embodiments, the LED chips can be electrically interconnected so that they emit light in response to one electrical signal that is conducted to all the LEDs chips in the array. In other embodiments emission the LEDs chips can be individually controlled by respective signals to control the emission intensity of each of the LED chips. This in turn can control the emission intensity of the LED array, and in arrays having LED chips emitting different colors of light, this can control the intensity and emission color of the overall array.

Figure 5:
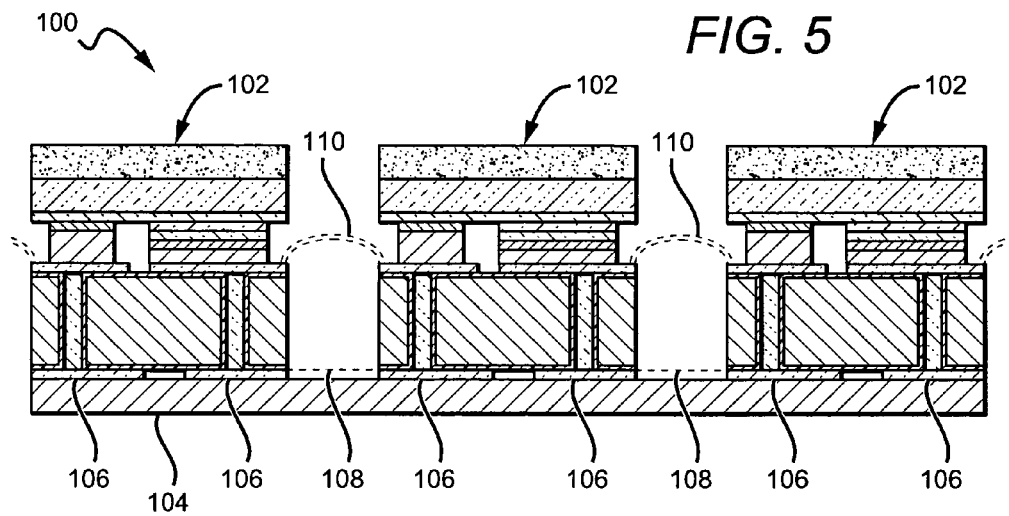
FIG. 5 is a sectional view of one embodiment of an LED wafer according to the present invention.

Referring now to FIG. 5 an LED chip array 100 is shown comprising a plurality of LED chips 102, each of which can comprise one of the LED chips described above. The array is shown with three LED chips 102, but it is understood that the array can include many more, or with less LED chips. The LED chips 102 are shown mounted in a package, such as to a PCB 104, and in the embodiment shown the LED chips are surface mounted to the package by bottom leads 106. The leads can be interconnected on the PCB by conductive traces 108 on the PCB so that one signal is conducted to all the LED chips. Alternatively, the LED chips can be interconnected by wire bonds 110 between adjacent LED chips 102 so that a signal applied to the array spreads to each of the LED chips in the array.

In still other embodiments, LEDs can be mounted to a submount wafer as described above, and coated with phosphor coating. Instead of singulating the LED chips, the submount wafer can be separated into portions that include multiple LEDs interconnected in an array by the electrical traces. These different embodiments are equally applicable to lead frame embodiments of the present invention.

Figure 6A:
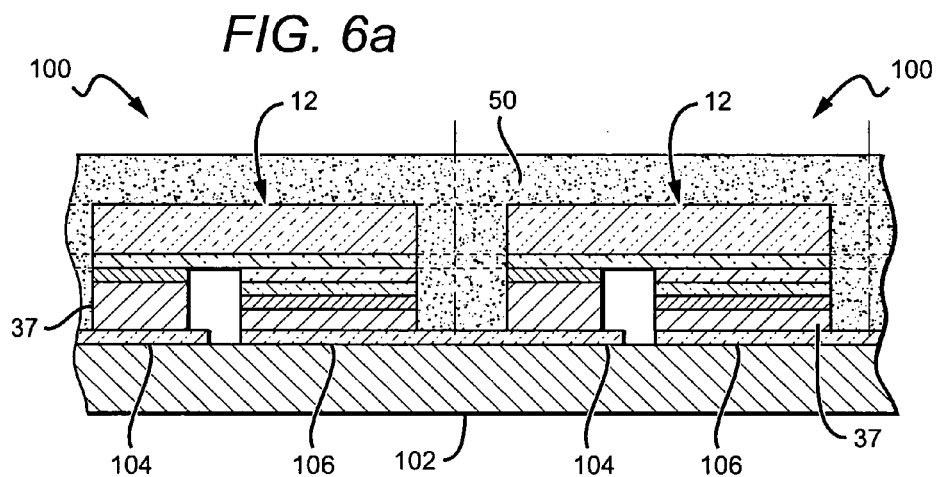
FIG. 6a is a sectional view of an embodiment of a LED wafer and temporary carrier at a fabrication step in one method according to the present invention.
Figure 6B:
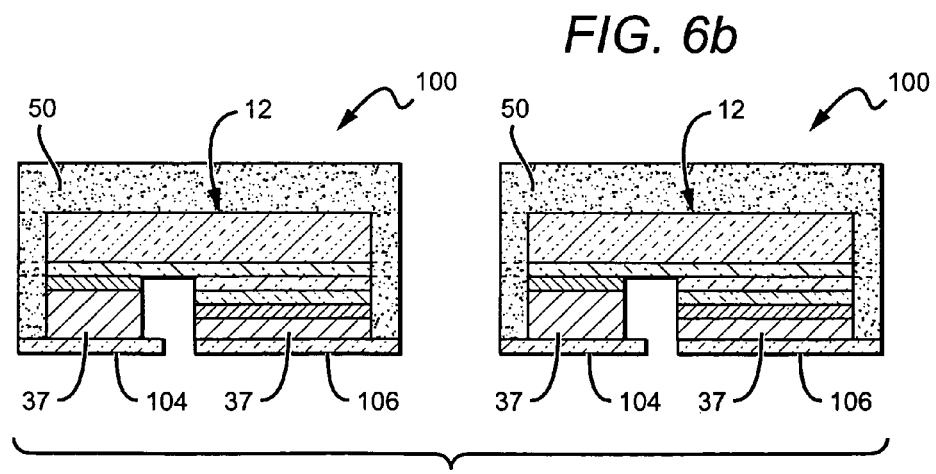
FIG. 6b is a sectional view of the LED wafer and temporary carrier in FIG. 6a following singulating.

FIGS. 6a and 6b show still another embodiment of LED chips 100 according to the present invention, with FIG. 6a showing the LED chips 100 in wafer form following application of the coating 50 over the LEDs 12. In this embodiment, however, the submount comprises a temporary carrier 102 that is to be removed following singulating of the LED chips 100. The LEDs 12 are flip chip mounted to the temporary carrier 102 by a bond material 37. The temporary carrier 102 can include first and second top traces 104, 106.

Referring now to FIG. 6b, following application of the coating 50 over the LEDs 12 and planarization of the coating 50, the temporary carrier can be removed. This can be done either before or after singulating of the LED chips 100. If done after, the temporary carrier can provide mechanical support through singulating, but this can complicate the removal process because the temporary carrier is then removed from individual LED chips. In either case, an LED chip 100 remains having a conformal conversion coating 50 and surface mount leads 104, 106. By removing the temporary carrier and not having a submount, the LED chips 100 can have reduced thermal resistance to the package they are mounted in, which can provide for improved heat spreading from the LED chips active layers. This can allow the LED chips to operate at higher power and higher temperature without overheating.

Figure 7A:
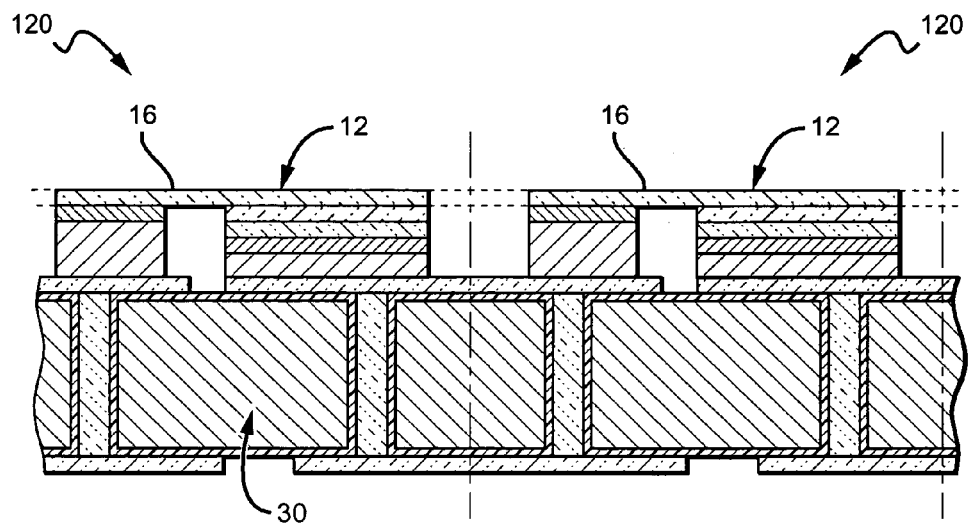
FIG. 7a is a sectional view of still another embodiment of a submount wafer and LED wafer at a fabrication step in one method according to the present invention.
Figure 7B:
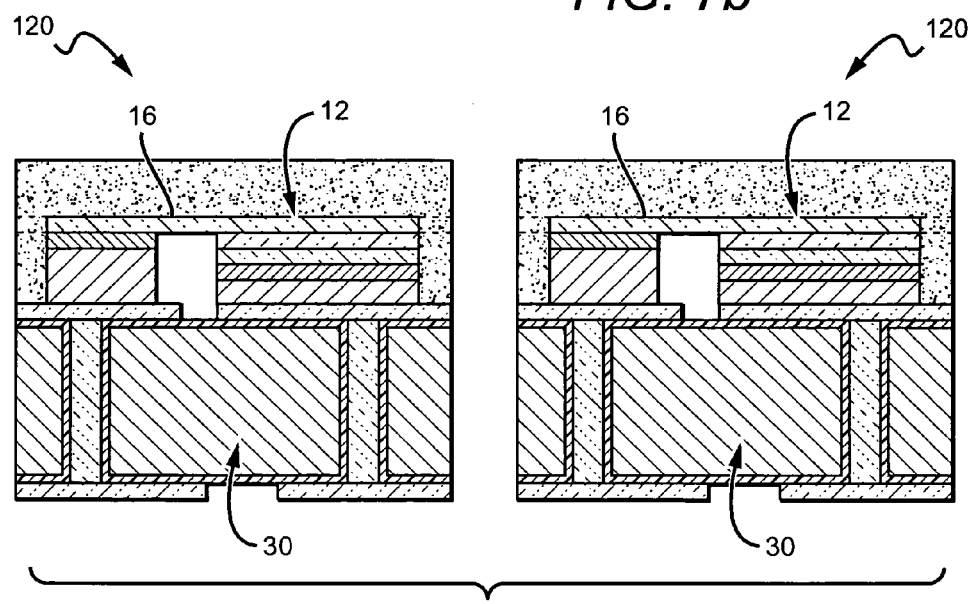
FIG. 7b is a sectional view of the submount wafer and LED wafer in FIG. 7a following singulating.

FIGS. 7a and 7b show still another embodiment of LED chips 120 according to the present invention, with FIG. 7a showing the LED chips 120 at the wafer level prior to application of the phosphor coating. In this embodiment, the LEDs 12 are flip-chip mounted to a submount wafer 30 similar to the flip-chip mounting shown in FIGS. 1a through 1e. In this embodiment, however, the substrate for the LEDs has been removed prior to application of the phosphor coating so that the top surface of the LED chips is the n-type layer 16. The substrate can be removed using many different known methods such as grinding, etching, ablation, or combinations thereof.

Referring now to FIG. 7b, the LED chips 120 are shown following application of the coating 50 and following singulating. The coating 50 covers the LED chips 12, and is on the n-type layer 16. By removing the substrate prior to coating, thinner LED chips 120 can be provided and any reduction in light extraction caused by the substrate can be avoided.

In other embodiments, portions of substrate can remain while in other embodiments the substrate can be textured or shaped. Removal of all or part of the substrate can be used in combination with the other embodiments described above. For example, one such embodiment can be fabricated with the LED chips flip-chip mounted on a temporary carrier and can have the substrate removed. The temporary carrier can then be removed with the resulting coated and singulated LED chips having a low profile and reduced thermal resistance.

In still other embodiments individual LEDs, or multiple LEDs, can be flip-chip mounted to a submount, with the LEDs grouped by different characteristics such as emission wavelength or intensity. For example, LEDs having emission characteristics from a particular bin as described above, can be flip-chip mounted to a submount, with the phosphor/binder coating then applied. The coating can then be thinned or planarized as desired. The resulting individual LED chips singulated from the submount having substantially the same color point based on the same emission characteristics and same thickness of phosphor/binder coating. In some multiple LED embodiments, groups of LEDs having similar or substantially the same emission characteristics can be separated from a wafer as an in-tact group. The group can then be flip-chip mounted to a submount, coated and singulated as described above, with the individual LED chips having substantially the same emission characteristics.

Although the present invention has been described in detail with reference to certain preferred configurations thereof, other versions are possible. Therefore, the spirit and scope of the invention should not be limited to the versions described above.

We claim:

1. A light emitting diode (LED) chip wafer, comprising:
   a submount wafer;
   a plurality of LEDs having contacts accessible at one side and mounted to said submount wafer so that said contacts are accessible at said submount wafer;
   a phosphor loaded binder coating at least partially covering said LEDs and having substantially the same thickness over each of said LEDs and being continuous and unobstructed over each of said LEDs such that the light emitted from each of said LEDs is substantially uniform, at least some of the light emitted from said LEDs passing through said coating where at least some of said LED light is converted by the phosphor in said coating;
   conductive vias through said submount wafer, wherein each of said conductive vias is in electrical contact with one of said contacts; and
   a dielectric material insulating said conductive vias from said submount wafer.

2. The LED chip wafer of claim 1, wherein at least some of said plurality of LEDs has lateral geometry.

3. The LED chip wafer of claim 2, wherein said at least some of said plurality of LED comprises oppositely doped layers with a mesa formed on one of said oppositely doped layers.

4. The LED chip wafer of claim 3, wherein said contacts comprise first and second contacts, the first being on said mesa of one of said oppositely doped layers and the second being on the other of said oppositely doped layers.

5. The LED chip wafer of claim 1, wherein at least some of said LEDs have a textured surface that comprises texture features larger than 10% of the thickness of said LED.

6. The LED chip wafer of claim 1, wherein said submount wafer is capable of being separated into LED chips.

7. The LED chip wafer of claim 1, wherein said coating has a uniform thickness above said LEDs.

8. The LED chip wafer of claim 1, wherein said coating has a textured surface.

9. The LED chip wafer of claim 1, wherein said coating comprises multiple phosphors.

10. The LED chip wafer of claim 1, wherein said coating comprises scattering particles.

11. The LED chip wafer of claim 1, wherein said LEDs are made of materials from the Group-III nitride material system.

12. The LED chip wafer of claim 1, wherein said submount wafer comprises a lead frame.

13. The LED chip wafer of claim 1, wherein said submount wafer comprises a temporary carrier.

14. The LED chip wafer of claim 1, wherein said LEDs are interconnected in an LED array.

15. The LED chip wafer of claim 1, further comprising a reflective layer formed integral to said substrate wafer.

16. The LED chip wafer of claim 1, wherein said coating comprises multiple layers with different compositions.

17. The LED chip wafer of claim 1, capable of emitting white light from said LEDs and coating.

18. A light emitting diode (LED) chip, comprising:
    a lateral geometry LED comprising first and second contacts, said LED flip-chip mounted to a submount by a conductive bonding material, an electrical signal applied to said LED through said submount;
    a uniform phosphor loaded binder coating on and covering the top surface of said LED such that light emitted from said LED is substantially uniform, said phosphor within said coating absorbing and converting the wavelength of at least some of said LED light, said coating planarized to achieve the desired emission color point of said LED chip,
    wherein said first and second contacts are accessible from a surface opposite said top surface;
    wherein said submount comprises electrically conductive vias electrically coupled to said contacts; and
    a dielectric material insulating said conductive vias from said submount.

19. The LED chip of claim 18, wherein said phosphor coating is continuous over the top surface of said LED and has a substantially uniform thickness.

20. The LED chip of claim 18, wherein said LED chip is adapted to emit a white light combination of LED light and light from said phosphor.

21. The LED chip of claim 18, wherein said conductive vias permit an electrical signal to be applied to said LED through said submount.

22. The LED chip of claim 18, wherein said submount comprises surface mount leads.

23. The LED chip of claim 18, wherein said submount comprises a lead frame.

24. The LED chip of claim 18, wherein said submount comprises a temporary carrier.

25. A light emitting diode (LED) package comprising:
    an LED chip comprising an LED flip chip mounted on a submount, said submount comprising surface mount leads and conductive vias through said submount and in electrical contact with said LED, said submount comprising a dielectric material insulating said conductive vias from said submount, said LED chip further comprising a uniform and continuous phosphor loaded binder coating on and covering at least all of the top surface of said LED such that light emitted from said LED is substantially uniform, said phosphor within said coating absorbing and converting the wavelength of at least some of said LED light, said coating planarized to achieve the desired emission color of said LED chip; and
    a second submount having a plurality of package leads, said LED chip mounted to said second submount in electrical connection with at least one of said package leads.

26. The package of claim 25, further comprising an encapsulation at least partially surrounding said LED.

27. The package of claim 25, further comprising secondary optics directly on said LED.

28. The package of claim 25, wherein said LED chip is adapted to emit white light.

* * * * *